US009601577B1

(12) United States Patent
Lee et al.

(10) Patent No.: US 9,601,577 B1
(45) Date of Patent: Mar. 21, 2017

(54) THREE-DIMENSIONALLY INTEGRATED CIRCUIT DEVICES INCLUDING OXIDATION SUPPRESSION LAYERS

(71) Applicant: Samsung Electronics Co., Ltd., Suwon-Si, Gyeonggi-do (KR)

(72) Inventors: Dong-Sik Lee, Osan-si (KR); Youngwoo Kim, Hwaseong-si (KR); Jinhyun Shin, Suwon-si (KR); Jung Hoon Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/251,510

(22) Filed: Aug. 30, 2016

Related U.S. Application Data

(60) Provisional application No. 62/239,054, filed on Oct. 8, 2015.

(30) Foreign Application Priority Data

Nov. 27, 2015 (KR) .......................... 10-2015-0167754

(51) Int. Cl.
H01L 29/10 (2006.01)
H01L 27/115 (2006.01)
H01L 23/522 (2006.01)
H01L 23/528 (2006.01)
H01L 29/423 (2006.01)
G11C 16/08 (2006.01)

(52) U.S. Cl.
CPC .......... H01L 29/1083 (2013.01); G11C 16/08 (2013.01); H01L 23/5226 (2013.01); H01L 23/5283 (2013.01); H01L 27/1157 (2013.01); H01L 27/11526 (2013.01); H01L 27/11551 (2013.01); H01L 27/11556 (2013.01); H01L 27/11573 (2013.01); H01L 27/11578 (2013.01); H01L 27/11582 (2013.01); H01L 29/42368 (2013.01)

(58) Field of Classification Search
CPC ............ H01L 29/1083; H01L 23/5226; H01L 27/11551; H01L 27/11582; H01L 27/11578; H01L 27/11556
See application file for complete search history.

(56) References Cited

U.S. PATENT DOCUMENTS 6,545,327 B2   4/2003   Tsuchiaki
8,319,275 B2   11/2012  Shim et al.
(Continued)

FOREIGN PATENT DOCUMENTS

JP   H10303138   11/1998

Primary Examiner — Joseph C Nicely
(74) Attorney, Agent, or Firm — Ward and Smith, P.A.

(57) ABSTRACT

A vertically integrated circuit device can include a substrate having a first region reserved for first functional circuits of the vertically integrated circuit device, where the first functional circuits has a substantially constant top surface level across the first region and having a second region reserved for second functional circuits of the vertically integrated circuit device and spaced apart from the first region. The second functional circuits can have a varied top surface level across the second region. A doped oxidation suppressing material can be included in the substrate and can extend from the first region to the second region at an interface of the substrate with the first functional circuits and the second functional circuits, respectively.

20 Claims, 40 Drawing Sheets

(56) References Cited

U.S. PATENT DOCUMENTS

| | | |
|---|---|---|
| 8,507,970 B2 | 8/2013 | Jeong et al. |
| 8,867,271 B2 | 10/2014 | Li et al. |
| 8,872,183 B2 | 10/2014 | Chang et al. |
| 9,419,013 B1* | 8/2016 | Lee .................... H01L 27/11582 |
| 2012/0003831 A1* | 1/2012 | Kang ................ H01L 27/11551 438/639 |
| 2012/0112264 A1* | 5/2012 | Lee .................... H01L 27/11551 257/324 |
| 2012/0276696 A1* | 11/2012 | Yang ................ H01L 27/11556 438/156 |
| 2013/0109158 A1* | 5/2013 | Lee .................... H01L 27/11582 438/488 |
| 2014/0264548 A1 | 9/2014 | Lee et al. |
| 2015/0279857 A1* | 10/2015 | Kim .................. H01L 27/11582 438/269 |
| 2016/0211027 A1 | 7/2016 | Kim |
| 2016/0300848 A1* | 10/2016 | Pachamuthu ......... H01L 21/768 |
| 2016/0322374 A1* | 11/2016 | Sano ................ H01L 27/11556 |

* cited by examiner

THREE-DIMENSIONALLY INTEGRATED CIRCUIT DEVICES INCLUDING OXIDATION SUPPRESSION LAYERS

CROSS-REFERENCE TO RELATED APPLICATIONS

This U.S. non-provisional patent application claims priority under 35 U.S.C. §119 to Korean Patent Application No. 10-2015-0167754, filed on Nov. 27, 2015, in the Korean Intellectual Property Office, and U.S. Provisional Application No. 62/239,054; filed in the U.S. Patent and Trademark Office on Oct. 8, 2015, the entire contents of each of which are hereby incorporated by reference.

FIELD

The disclosure relates to the field of semiconductors, and in particular, to three-dimensional semiconductor memory devices.

BACKGROUND

The integration of typical two-dimensional or planar semiconductor devices may be mainly determined by the area occupied by a unit memory cell and may be influenced by the level of a fine pattern forming technology. However, the expensive processing equipment that may be needed to increase pattern fineness may set a practical limitation on the increase in the level of integration for two-dimensional or planar semiconductor devices. To overcome such a limitation, there have been recently proposed three-dimensional semiconductor memory devices including three-dimensionally arranged memory cells.

SUMMARY

In some embodiments, a vertically integrated circuit device can include a substrate having a first region reserved for first functional circuits of the vertically integrated circuit device, where the first functional circuits has a substantially constant top surface level across the first region and having a second region reserved for second functional circuits of the vertically integrated circuit device and spaced apart from the first region. The second functional circuits can have a varied top surface level across the second region. A doped oxidation suppressing material can be included in the substrate and can extend from the first region to the second region at an interface of the substrate with the first functional circuits and the second functional circuits, respectively.

In some embodiments, a three-dimensional semiconductor memory device can include an oxidation suppressing layer in a substrate and a plurality of stacks on the oxidation suppressing layer, where each of the stacks includes a horizontal gate insulating layer on the oxidation suppressing layer, and insulating layers and electrodes are alternately and vertically stacked on the horizontal gate insulating layer. A plurality of vertical structures can pass through the stacks and connect to the substrate.

In some embodiments, a three-dimensional semiconductor memory device can include a substrate including a cell array region, a peripheral circuit region, and a connection region between the cell array region and the peripheral circuit region. A plurality of stacks can extend from the cell array region to the connection region, where each stack includes a horizontal gate insulating layer, and insulating layers and electrodes alternately and vertically stacked on the horizontal gate insulating layer. An oxidation suppressing layer can be in the substrate, where the oxidation suppressing layer is in contact with the horizontal gate insulating layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 5A to 14A are sectional views, which are taken along line I-I' of FIG. 4 to illustrate a method of fabricating a three-dimensional semiconductor memory device according to some example embodiments of the inventive concepts.

FIGS. 5B to 14B are sectional views, which are taken along line II-II' of FIG. 4 to illustrate a method of fabricating a three-dimensional semiconductor memory device according to some example embodiments of the inventive concepts.

FIGS. 15A to 17A are enlarged sectional views illustrating portions 'A' of FIGS. 11A to 13A, respectively.

FIGS. 15B to 17B are enlarged sectional views illustrating portions 'B' of FIGS. 11B to 13B, respectively.

Figure 1:
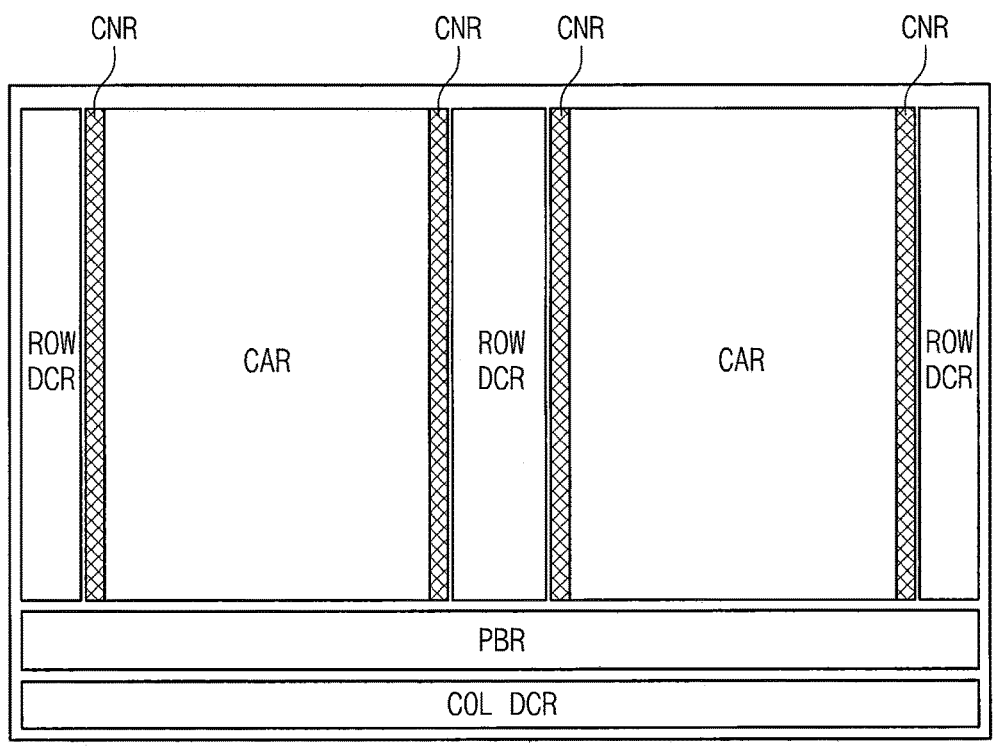
FIG. 1 is a plan view exemplarily illustrating a chip layout of a three-dimensional semiconductor memory device according to some example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Exemplary embodiments of aspects of the present inventive concepts explained and illustrated herein include their complementary counterparts. The same reference numerals or the same reference designators denote the same elements throughout the specification.

Figure 2:
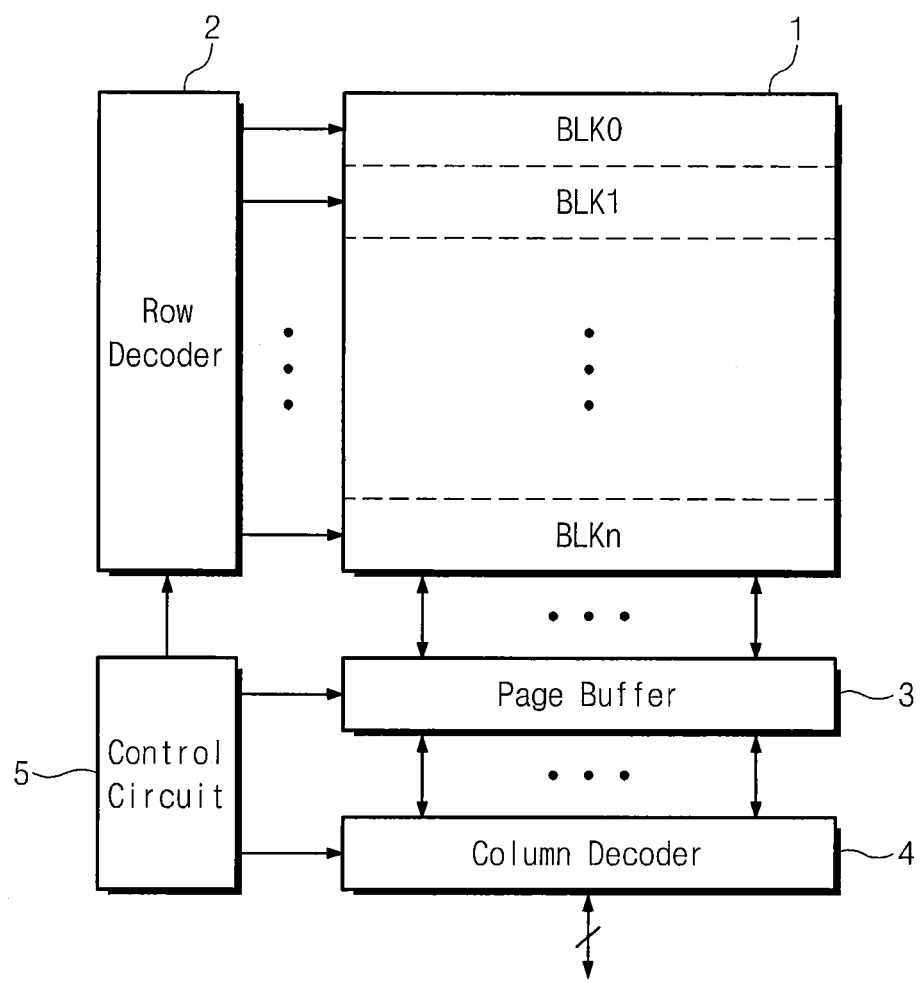
FIG. 2 is a block diagram schematically illustrating a three-dimensional semiconductor memory device according to some example embodiments of the inventive concepts.

FIG. 1 is a plan view exemplarily illustrating a chip layout of a three-dimensional semiconductor memory device according to some example embodiments of the inventive concepts. FIG. 2 is a block diagram illustrating a three-dimensional semiconductor memory device according to some example embodiments of the inventive concepts.

Referring to FIG. 1, a three-dimensional semiconductor memory device may include a cell array region CAR and a peripheral circuit region. The peripheral circuit region may include at least one row decoder region ROW DCR, at least one page buffer region PBR, and at least one column decoder region COL DCR. Furthermore, a connection region CNR may be provided between the cell array region CAR and each row decoder region ROW DCR.

Referring to FIGS. 1 and 2, a memory cell array 1 including a plurality of memory cells may be provided on the cell array region CAR. The memory cell array 1 may further include word and bit lines electrically connected to the memory cells, in addition to the memory cells. The memory cell array 1 may include a plurality of memory blocks BLK0-BLKn, each of which is configured to independently perform an erase operation. The memory cell array 1 will be described in more detail with reference to FIG. 3.

In each row decoder region ROW DCR, a row decoder 2 may be provided to allow for selection of the word lines provided in the memory cell array 1. An interconnection structure may be provided on the connection region CNR to electrically connect the memory cell array 1 to the row decoder 2. The row decoder 2 may be configured to select a specific one of the memory blocks BLK0-BLKn of the memory cell array 1 and moreover a specific one of the word lines of the selected memory block, depending on address information. In addition, the row decoder 2 may be configured to provide word-line voltages, which are generated by a voltage generator, to the selected word line and un-selected word lines, in response to control signals from a control circuit.

In each page buffer region PBR, at least one page buffer 3 may be provided to read out data stored in the memory cells. Depending on an operation mode, each page buffer 3 may execute a process of temporarily storing data to be stored in the memory cells or of reading out data stored in the memory cells. For example, the page buffer 3 may function as a write driver in a program operation mode or as a sense amplifier in a read operation mode.

A column decoder 4 connected to the bit lines of the memory cell array 1 may be provided in each column decoder region COL DCR. The column decoder 4 may be configured to provide data-transmission paths between the page buffer 3 and an external device (e.g., a memory controller).

Figure 3:
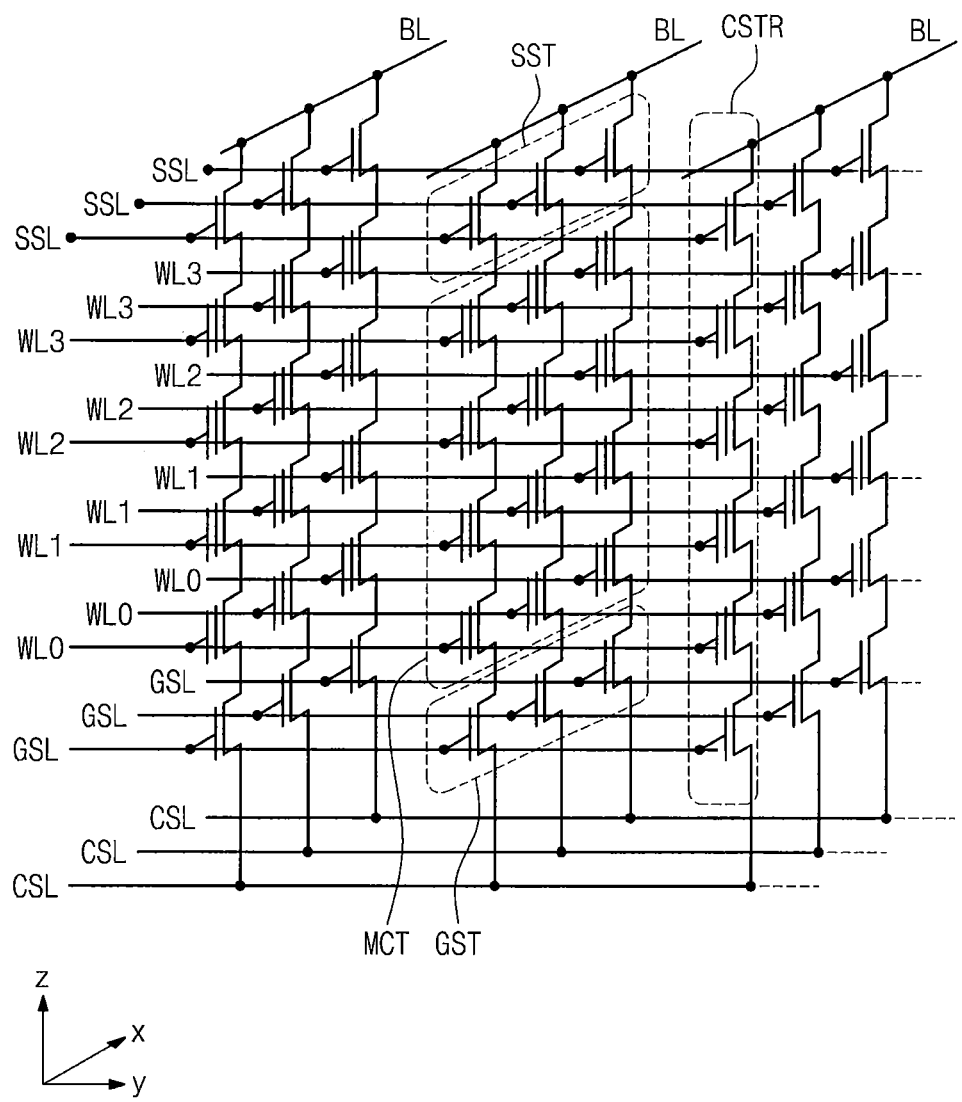
FIG. 3 is a schematic circuit diagram of a three-dimensional semiconductor memory device according to some example embodiments of the inventive concepts.

FIG. 3 is a schematic circuit diagram illustrating a cell array of a three-dimensional semiconductor memory device according to some example embodiments of the inventive concepts.

Referring to FIG. 3, a cell array of a semiconductor memory device according to some example embodiments of the inventive concepts may include a common source line CSL, a plurality of bit lines BL, and a plurality of cell strings CSTR disposed between the common source line CSL and the bit lines BL.

The bit lines BL may be two-dimensionally arranged and the plurality of the cell strings CSTR may be connected in parallel to each of the bit lines BL. The cell strings CSTR may be connected in common to the common source line CSL. That is, the plurality of the cell strings CSTR may be disposed between the common source line CSL and one of the bit lines BL. As an example, the cell array may include a plurality of two-dimensionally arranged common source lines CSL. In some embodiments, the common source lines CSL may be connected with each another and be in an equipotential state, but in certain embodiments, the common source lines CSL may be electrically separated from each other such that they can be controlled independently.

Each of the cell strings CSTR may include a ground selection transistor GST coupled to the common source line CSL, a string selection transistor SST coupled to the bit line BL, and a plurality of memory cell transistors MCT disposed between the ground and string selection transistors GST and SST. The ground selection transistor GST, the memory cell transistors MCT, and the string selection transistor SST may be connected in series.

Sources regions of the ground selection transistors GST may be connected in common to the common source line CSL. In addition, at least one ground selection line GSL, a plurality of word lines WL0-WL3, and a plurality of string selection lines SSL may be disposed between the common source line CSL and the bit lines BL to serve as gate electrodes of the ground selection transistor GST, the memory cell transistors MCT, and the string selection transistors SST, respectively. Furthermore, each of the memory cell transistors MCT may include a data storage element or a data storing layer.

Figure 4:
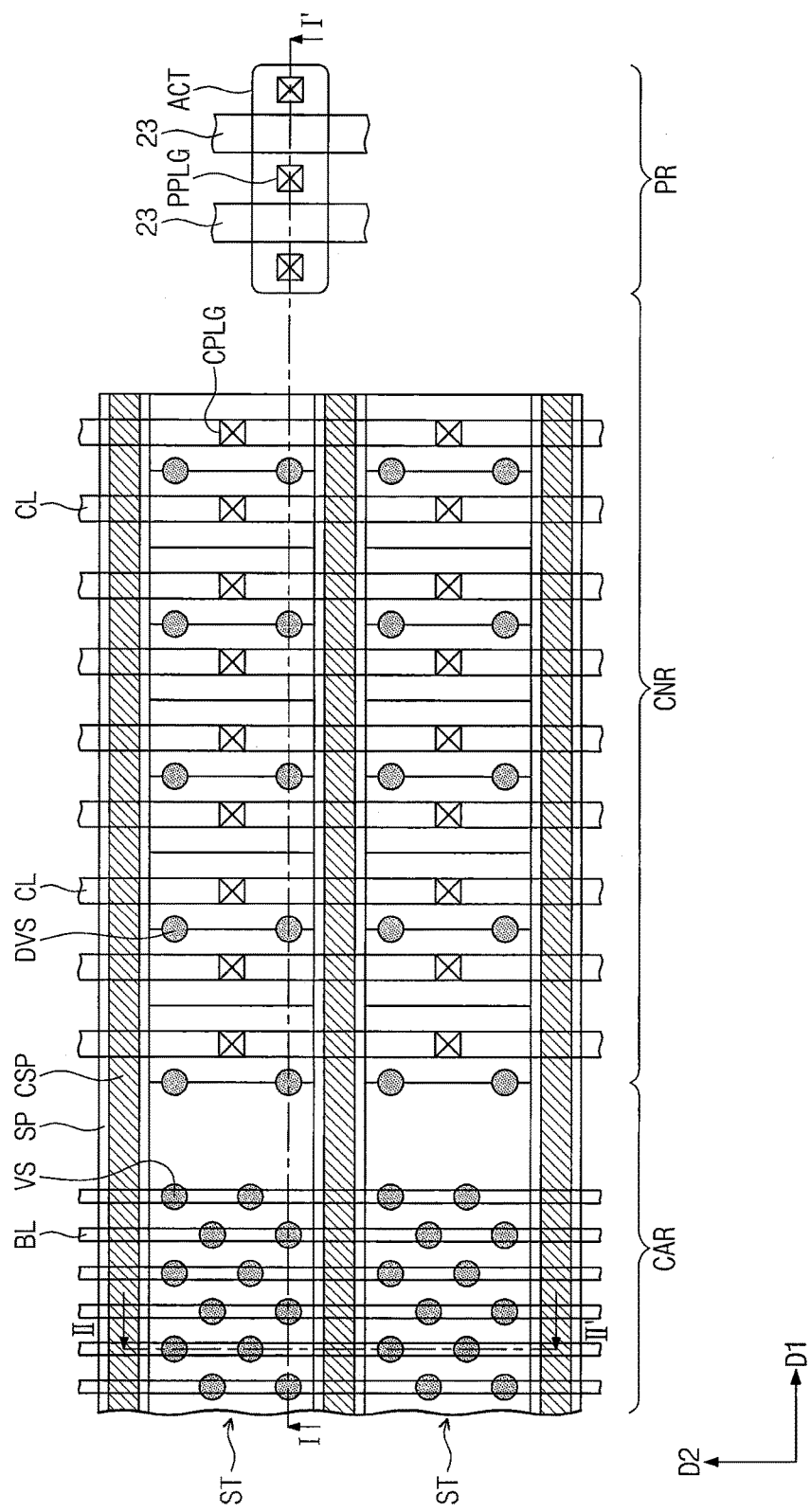
FIG. 4 is a plan view of a three-dimensional semiconductor memory device according to some example embodiments of the inventive concepts.

FIG. 4 is a plan view of a three-dimensional semiconductor memory device according to some example embodiments of the inventive concepts. FIGS. 5A to 14A and 5B to 14B are sectional views illustrating a method of fabricating a three-dimensional semiconductor memory device according to some example embodiments of the inventive concepts. In detail, FIGS. 5A to 14A are sectional views, each of which is taken along line I-I' of FIG. 4, and FIGS. 5B to 14B are sectional views, each of which is taken along line of FIG. 4.

Figure 16A:
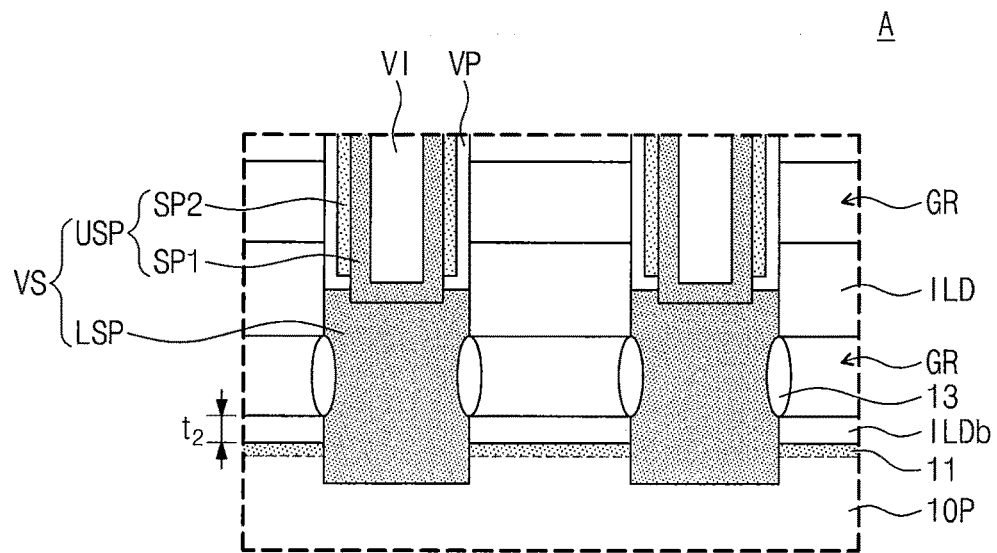
Figure 16B:
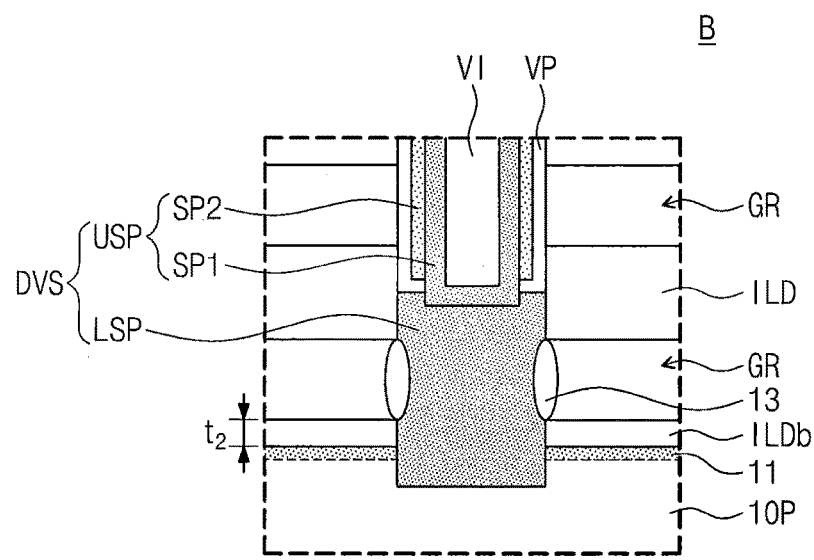
Figure 17A:
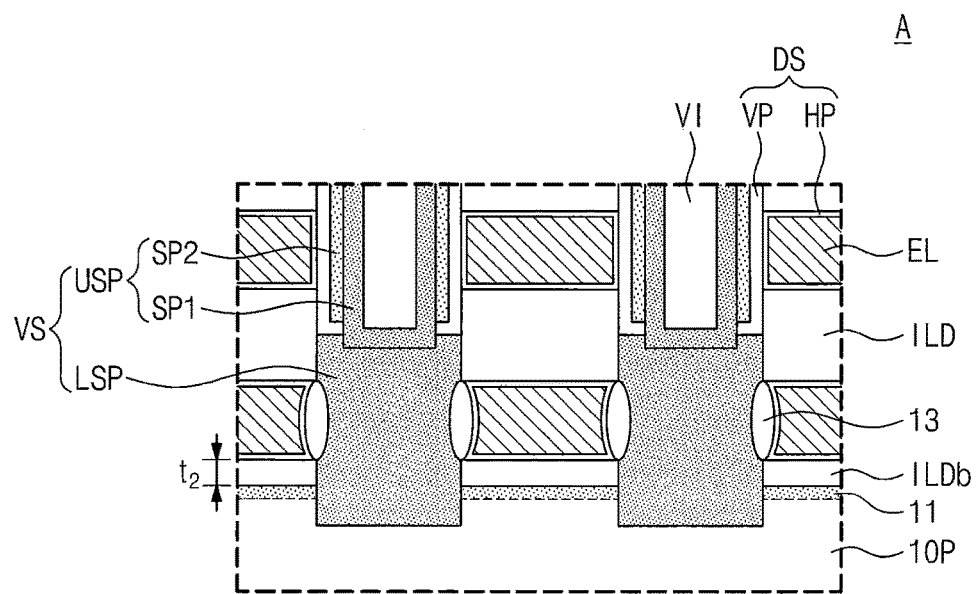
Figure 17B:
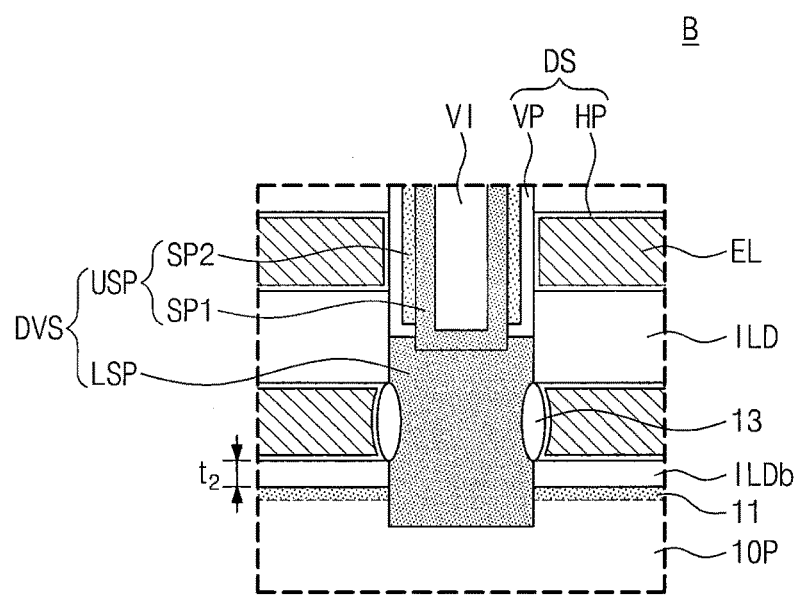
Figure 18:
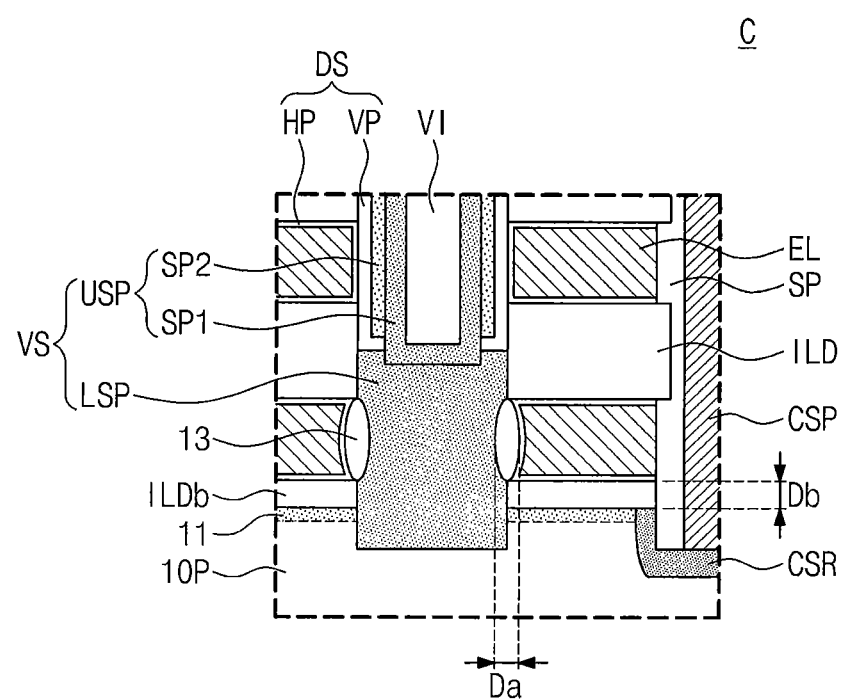
FIG. 18 is an enlarged sectional view illustrating a portion 'C' of FIG. 14B.

FIGS. 15A to 17A are enlarged sectional views illustrating portions 'A' of FIGS. 11A to 13A, respectively, and FIGS. 15B to 17B are enlarged sectional views illustrating portions 'B' of FIGS. 11B to 13B, respectively. FIG. 18 is an enlarged sectional view illustrating a portion 'C' of FIG. 14B.

Figure 5A:
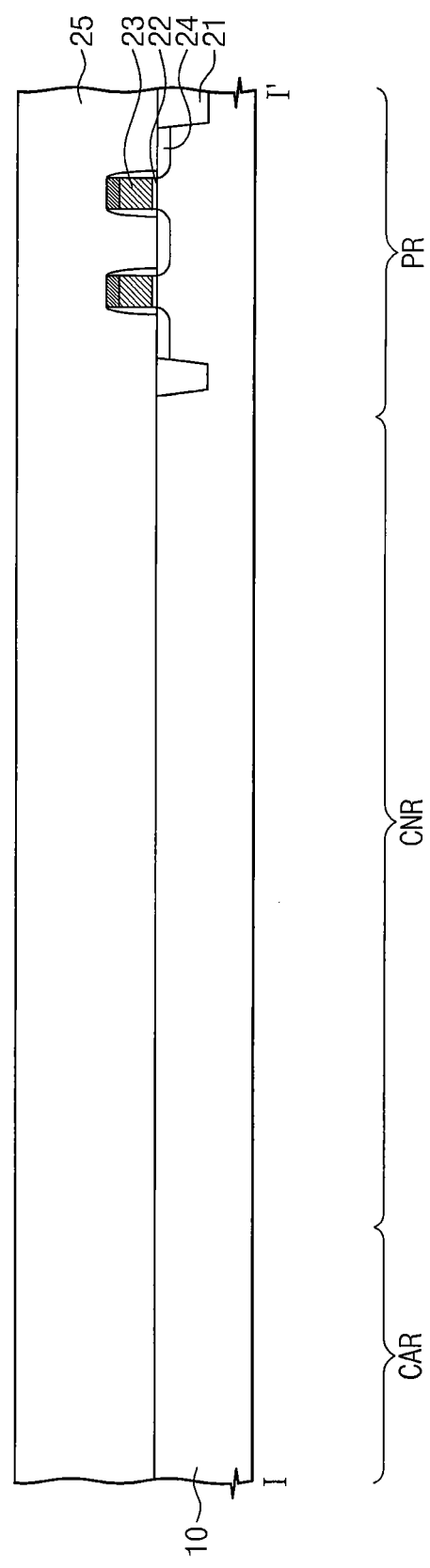
Figure 5B:
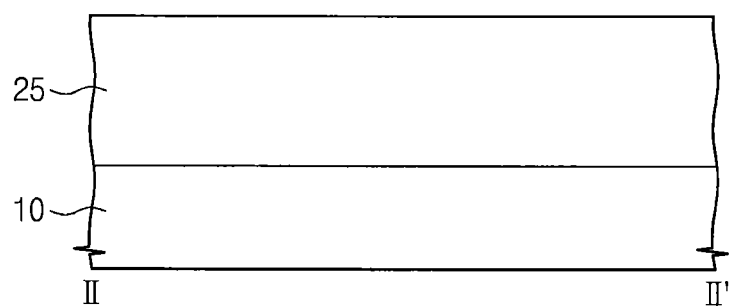

Referring to FIGS. 4, 5A, and 5B, a substrate 10 may include the cell array region CAR, the connection region CNR, and a peripheral circuit region PR. The connection region CNR may be positioned between the cell array region CAR and the peripheral circuit region PR.

The substrate 10 may be one of semiconductor materials (e.g., a silicon wafer), insulating materials (e.g., a glass), or semiconductor or conductive materials covered with an insulating material. For example, the substrate 10 may be a silicon wafer of a first conductivity type.

Peripheral logic circuits may be provided on the peripheral circuit region PR of the substrate 10 to read or write data from or to the memory cells. The peripheral logic circuits may include row and column decoders 2 and 4, the page buffer 3, and the control circuits 5, as described with reference to FIG. 2. For example, the peripheral logic circuits may include NMOS and PMOS transistors, resistors, and capacitors, which are electrically connected to the memory cells.

For example, a device isolation layer 21 may be formed on the peripheral circuit region PR of the substrate 10 to define a peripheral active region ACT. A peripheral gate electrode 23 may be formed to cross the peripheral active region ACT, and a peripheral gate insulating layer 22 may be formed between the peripheral gate electrode 23 and the substrate 10. The peripheral gate electrode 23 may be formed of or include at least one of doped polysilicon, metal silicides, or metals, and the peripheral gate insulating layer 22 may be a silicon oxide layer formed by a thermal oxidation process. Also, source/drain regions 24 may be formed at both sides of the peripheral gate electrode 23 by implanting N-type or P-type dopant ions into the active region ACT of the substrate 10.

After the formation of the peripheral logic circuits, a peripheral insulating layer 25 may be formed to cover the substrate 10 provided with the peripheral logic circuits. The peripheral insulating layer 25 may include a plurality of insulating layers (for example, including at least one of a silicon oxide layer, a silicon nitride layer, a silicon oxynitride layer, or low-k dielectric layers).

Figure 6A:
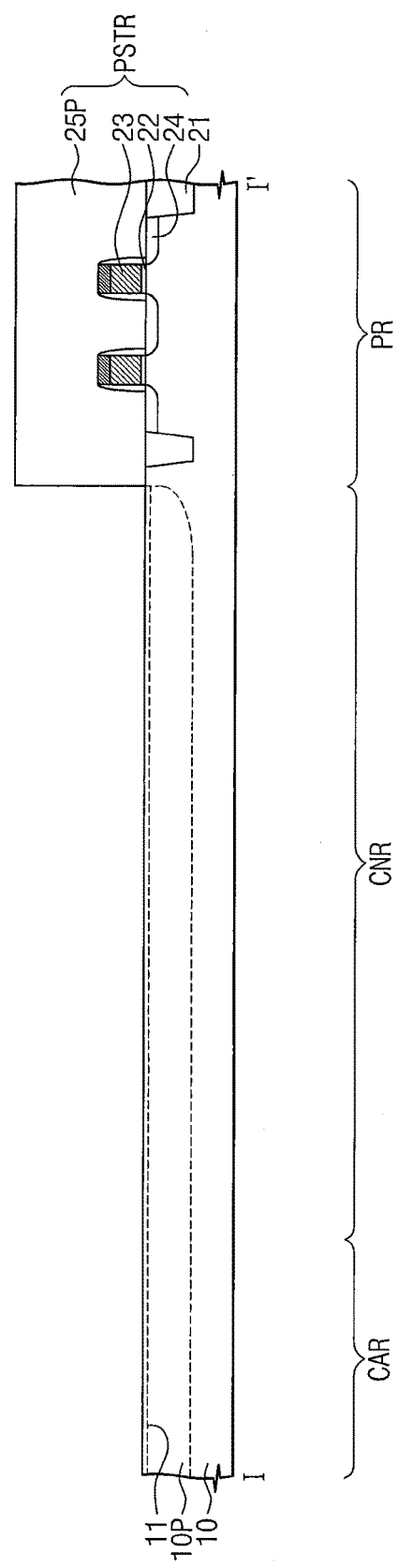
Figure 6B:
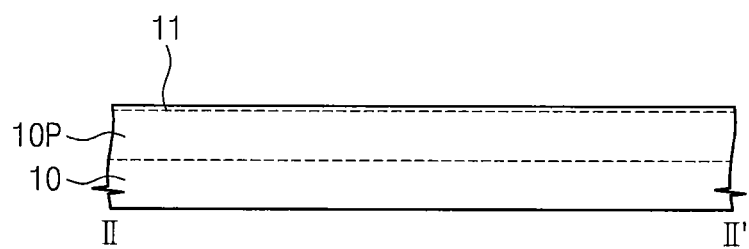

Referring to FIGS. 4, 6A, and 6B, the peripheral insulating layer 25 may be patterned to form a peripheral insulating pattern 25P exposing the cell array region CAR and the connection region CNR of the substrate 10. As a result of the formation of the peripheral insulating pattern 25P, a peripheral logic structure PSTR may be formed on the peripheral circuit region PR of the substrate 10, and here, the peripheral logic structure PSTR may include the peripheral gate insulating layer 22, the peripheral gate electrode 23, the source/drain regions 24, and the peripheral insulating pattern 25P.

The formation of the peripheral insulating pattern 25P may include forming a mask pattern on the peripheral insulating layer 25 to cover the peripheral circuit region PR and etching the peripheral insulating layer 25 using the mask pattern as an etch mask.

For example, the peripheral insulating layer 25 may be etched by an etching process using plasma. The etching process may be a plasma etching process, a reactive ion etching (RIE) process, a radio frequency inductively-coupled plasma reactive ion etching (ICP-RIE) process, or an ion beam etching (IBE) process.

As an example, the process of etching the peripheral insulating layer 25 may be performed using an etching gas containing a fluorocarbon (CxFy)-based gas or a hydrofluorocarbon (CxHyFz)-based gas. For example, the etching gas may contain at least one of $CF_4$, $C_3F_8$, $C_4F_8$, or $CH_2F_2$.

In some embodiments, after the formation of the peripheral insulating pattern 25P, an oxidation suppressing layer 11 may be formed on the substrate 10 exposed by the peripheral insulating pattern 25P. The oxidation suppressing layer 11 may be formed adjacent to a top surface of the substrate 10. For example, the oxidation suppressing layer 11 may include an oxidation suppressing material (e.g., carbon C, nitrogen N, or fluorine F). The oxidation suppressing layer 11 may be formed to have a thickness ranging from about 50 Å to 150 Å.

In the case where the etching gas containing carbon and fluorine is used in the process of etching the peripheral insulating layer 25 using plasma, carbon atoms in the etching gas may be ionized. Such carbon ions may be used to form the oxidation suppressing layer 11 on the top surface of the substrate 10 exposed by the peripheral insulating pattern 25P. In other words, the oxidation suppressing layer 11 may be formed in situ during the etching process for forming the peripheral insulating pattern 25P. Also, a carbon concentration in the oxidation suppressing layer 11 may be changed depending on RF power condition in the plasma etching process. For example, if the plasma etching process is performed with high RF power, an amount of carbon ions to be infiltrated into the exposed surface of the substrate 10 may be increased.

In certain embodiments, the oxidation suppressing layer 11 may be formed by implanting the oxidation suppressing material into the substrate 10, and the peripheral insulating pattern 25P may be used as an ion implantation mask in such an ion implantation process.

In some embodiments, after the formation of the peripheral insulating pattern 25P, a well impurity layer 10P of a first conductivity type may be formed in the substrate 10 exposed by the peripheral insulating pattern 25P. For example, the well impurity layer 10P may be formed in the cell array region CAR and the connection region CNR of the substrate 10. The well impurity layer 10P may be formed by implanting impurities of the first conductivity type into the substrate 10. If the well impurity layer 10P is formed, the substrate 10 may include a semiconductor layer of a second conductivity type, and the well impurity layer 10P may be formed in the semiconductor layer of the second conductivity type.

In certain embodiments, the oxidation suppressing layer 11 may be formed by implanting the oxidation suppressing material into the substrate 10, and the process of implanting the oxidation suppressing material may be performed as a part of the process of forming the well impurity layer 10P.

Figure 7A:
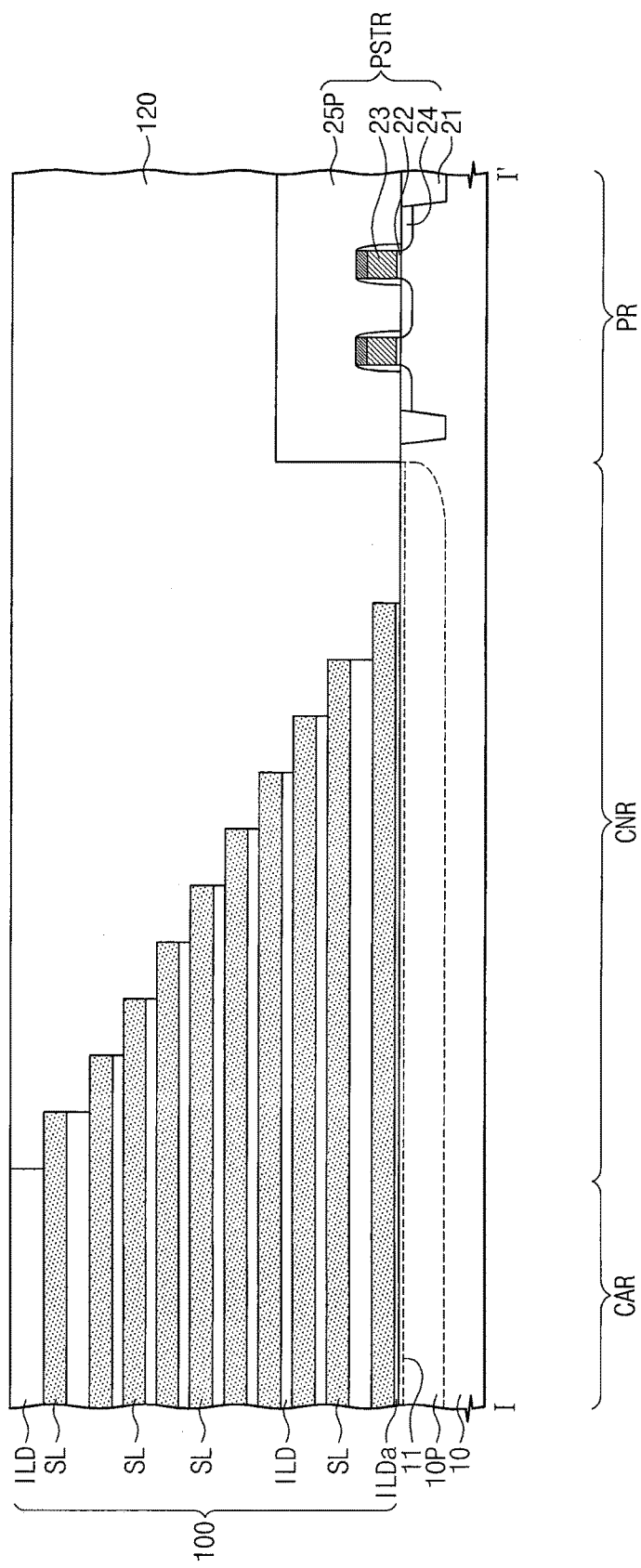
Figure 7B:
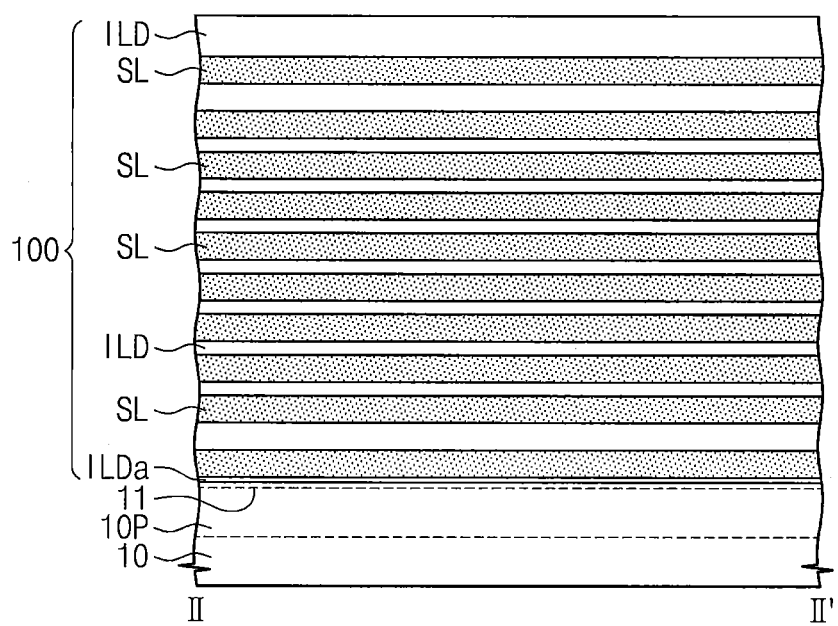

Referring to FIGS. 4, 7A, and 7B, a mold structure 100 may be formed on the substrate 10 to cover the cell array region CAR and the connection region CNR. The mold structure 100 may be formed to have a thickness decreasing stepwise in a direction from the connection region CNR toward the peripheral circuit region PR (a staircase structure).

For example, the formation of the mold structure 100 may include forming a layered structure on the substrate 10 and performing a trimming process on the layered structure.

In some embodiments, the layered structure may be formed to cover the substrate 10 of the cell array region CAR and the peripheral logic structure PSTR. The layered structure may include a buffer insulating layer ILDa formed on the substrate 10, and sacrificial and insulating layers SL and ILD alternately and vertically stacked on the buffer insulating layer ILDa. The buffer insulating layer ILDa may be a silicon oxide layer, which may be formed by a thermal oxidation process or a deposition process. In some example embodiments, the buffer insulating layer ILDa may be formed on the oxidation suppressing layer 11 and may contact the oxidation suppressing layer 11.

In the layered structure, the sacrificial layers SL may be formed of a material, which can be etched with a high etch selectivity with respect to the insulating layers ILD. For example, the sacrificial layers SL and the insulating layers ILD may be selected in such a way that they have a high etch selectivity in a wet etching process using a chemical solution and a low etch selectivity in a dry etching process using an etching gas. As an example, the sacrificial layers SL and the insulating layers ILD may be formed of insulating materials having an etch selectivity with respect to each other. In other words, the sacrificial layers SL may be formed of an insulating material different from the insulating layers ILD. For example, the sacrificial layers SL may be at least one of a silicon layer, a silicon oxide layer, a silicon carbide layer, a silicon germanium layer, a silicon oxynitride layer, a silicon nitride layer, or low-k dielectric layers. The insulating layers ILD may be at least one of a silicon layer, a silicon oxide layer, a silicon carbide layer, a silicon oxynitride layer, a silicon nitride layer, or low-k dielectric layers, but it may be formed of a material selected to be different from the sacrificial layers SL. For example, the sacrificial layers SL may be formed of a silicon nitride layer, and the insulating layers ILD may be formed of a low-k dielectric layer. In certain embodiments, the sacrificial layers SL may be formed of a conductive material, and the insulating layers ILD may be formed of an insulating material.

The sacrificial layers SL and the insulating layers ILD may be deposited by a thermal chemical vapor deposition (thermal CVD) process, a plasma-enhanced CVD process, a physical CVD process, or an atomic layer deposition (ALD) process.

In the layered structure, the sacrificial layers SL may be formed to have substantially the same thickness. Alternatively, the uppermost and lowermost layers of the sacrificial layers SL may be formed to be thicker than the others therebetween. The insulating layers ILD may have substantially the same thickness or at least one of the insulating layers ILD may have a different thickness from the others. Furthermore, the buffer insulating layer ILDa, which is the lowermost layer of the layered structure, may be formed to be thinner than the sacrificial layers SL and the insulating layers ILD thereon. For example, the buffer insulating layer ILDa may have a thickness smaller than the minimum thickness of the insulating layers ILD.

Thereafter, a trimming process of patterning the layered structure may be performed to form the staircase structure on the connection region CNR. In detail, the trimming process may include steps of forming a mask pattern to cover the layered structure on the cell array region CAR and the connection region CNR, etching the layered structure using the mask pattern as an etch mask, etching the mask pattern to reduce a planar area of the mask pattern, and removing the mask pattern, and the steps of etching the layered structure and the mask pattern may be repeated several times, before removing the mask pattern. As a result of the trimming process, the mold structure 100 may be formed on the cell array region CAR and the connection region CNR of the substrate 10. The mold structure 100 may be spaced apart from the peripheral logic structure PSTR and the substrate 10 may be partially exposed between the mold structure 100 and the peripheral logic structure PSTR. The mold structure 100 may have a staircase structure, whose thickness decreases in a direction from the connection region CNR toward the peripheral circuit region PR. In other words, the insulating layers ILD and the sacrificial layers SL may have end portions positioned on the connection region CNR, and the insulating layers ILD and the sacrificial layers SL may have an area that decreases with increasing distance from the top surface of the substrate 10. In other words, the thickness of the mold structure 100 may decrease in a stepwise manner, when viewed in the direction from the connection region CNR toward the peripheral circuit region PR.

Thereafter, as shown in FIGS. 7A and 7B, an filling insulation layer 120 may be formed on the substrate 10 to cover the mold structure 100 and the peripheral logic structure PSTR. The filling insulation layer 120 may be formed of an insulating material having an etch selectivity with respect to sacrificial layers.

The formation of the filling insulation layer 120 may include depositing an insulating layer on the substrate 10 to cover the mold structure 100 and the peripheral logic structure PSTR and then performing a planarization process on the insulating layer. As a result, the filling insulation layer 120 may be formed to cover the end portions of the sacrificial layers SL of the mold structure 100 on the connection region CNR and to cover the peripheral logic structure PSTR on the peripheral circuit region PR and may have a flat top surface. In some embodiments, the filling insulation layer 120 may cover a portion of the oxidation suppressing layer 11 exposed between the mold structures 100 and the peripheral logic structure PSTR.

The filling insulation layer 120 may be formed of at least one of, for example, high density plasma (HDP) oxide, tetraethylorthosilicate (TEOS), plasma-enhanced TEOS, $O_3$-TEOS, undoped silicate glass (USG), phosphosilicate glass (PSG), borosilicate glass (BSG), borophosphosilicate glass (BPSG), fluoride silicate glass (FSG), spin-on-glass (SOG), tonen silazene (TOSZ), or any combination thereof. In addition, the filling insulation layer 120 may include or may further include a silicon nitride layer, a silicon oxynitride layer, or a low-k dielectric layer.

Figure 8A:
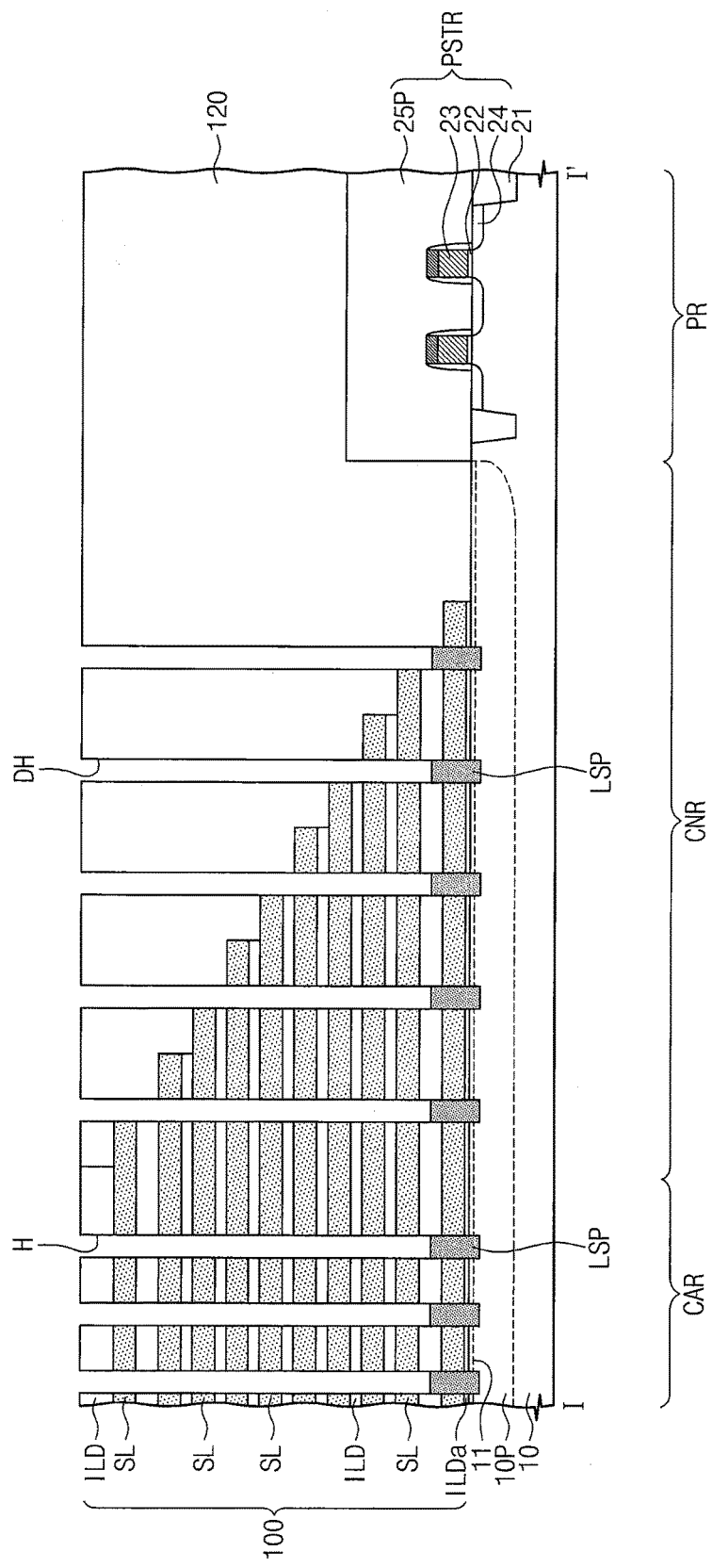
Figure 8B:
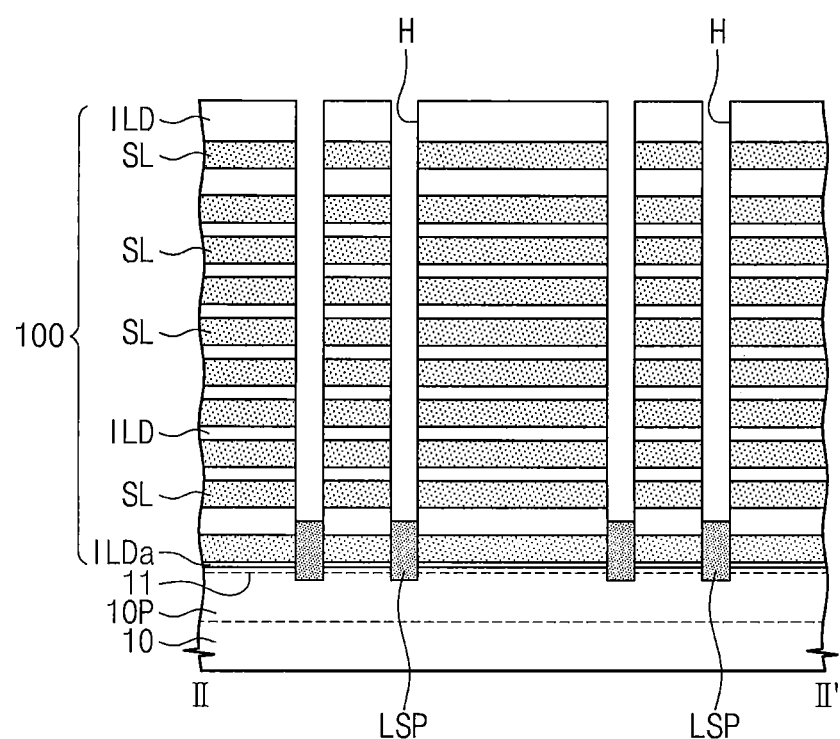

Referring to FIGS. 4, 8A, and 8B, a plurality of vertical holes H and DH may be formed to penetrate the mold structure 100. In some embodiments, the vertical holes H and DH may include cell vertical holes H formed on the cell array region CAR and dummy vertical holes DH formed on the connection region CNR.

In some example embodiments, the formation of the vertical holes H and DH may include forming a mask pattern on the mold structure 100 and anisotropically etching the mold structure 100 using the mask pattern as an etch mask. In certain embodiments, the top surface of the substrate 10 may be over-etched during the anisotropic etching process, and thus, a portion of the top surface of the substrate 10 exposed by the vertical holes H and DH may be recessed to have a specific depth. In some embodiments, the vertical holes H and DH may be formed to penetrate the oxidation suppressing layer 11 and thereby to expose the well impurity layer 10P in the substrate 10. The vertical holes H and DH may be formed in such a way that its lower width is less than its upper width.

Furthermore, when viewed in a plan view, the cell vertical holes H may be arranged along a specific direction or in a zigzag pattern. The dummy vertical holes DH may be formed to penetrate the end portions of the filling insulation layer 120 and the sacrificial layers SL. Since the dummy vertical holes DH are formed on the connection region CNR, the number of the sacrificial layers SL intersecting with the dummy vertical holes DH is inversely proportional to a distance between the dummy vertical hole DH and the peripheral circuit region PR.

In some embodiments, the dummy vertical hole DH may be formed to penetrate the end portions of some of the sacrificial layers SL and may be spaced apart from each other by a predetermined space, but the inventive concept is not limited thereto. For example, in certain embodiments, the dummy vertical hole DH may be formed to penetrate the end portion of one of the sacrificial layers SL. Alternatively, the formation of the dummy vertical holes DH may be omitted.

Next, a lower semiconductor pattern LSP may be formed in lower regions of the vertical holes H and DH.

Figure 15A:
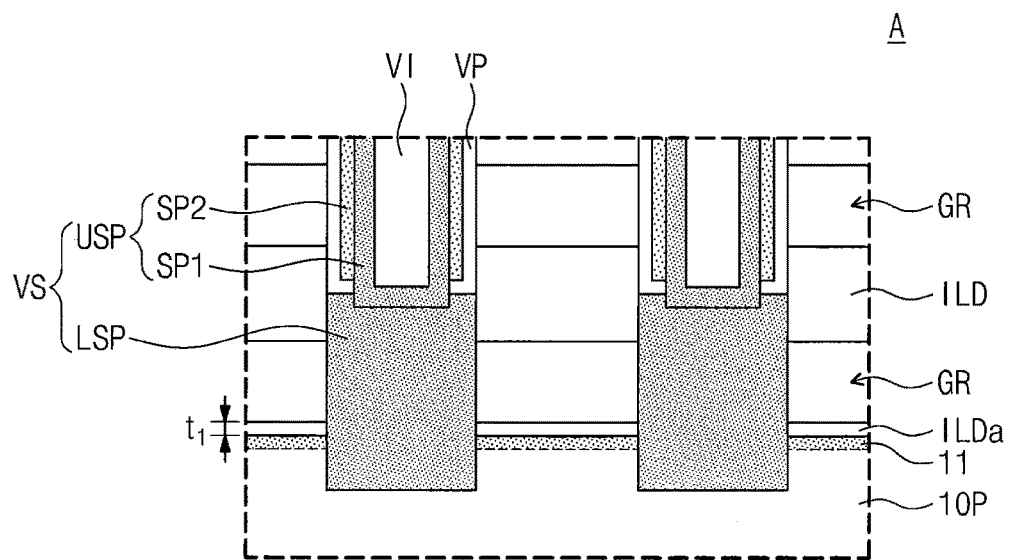
Figure 15B:
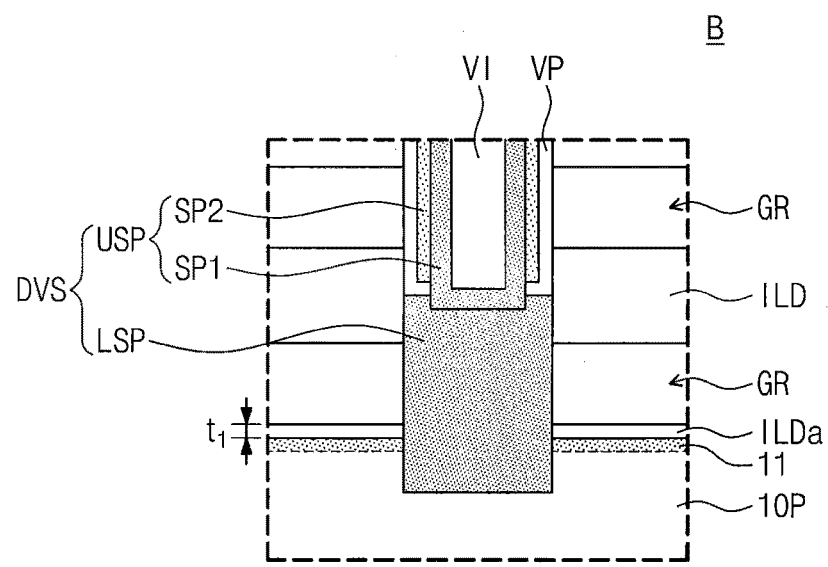

In some embodiments, as shown in FIGS. 15A and 15B, the lower semiconductor pattern LSP may be provided to penetrate the oxidation suppressing layer 11 and be in contact with the well impurity layer 10P. In other words, a bottom surface of the lower semiconductor pattern LSP may be positioned at a level lower than the top surface of the substrate 10 and the bottom surface of the oxidation suppressing layer 11. In addition, the lower semiconductor pattern LSP may be in contact with sidewalls of some of the sacrificial and insulating layers SL and ILD, which are provided at a lower level of the mold structure 100. The lower semiconductor pattern LSP may be formed to cover the sidewall of at least one of the sacrificial layers SL. A top surface of the lower semiconductor pattern LSP may be positioned between an adjacent pair of the sacrificial layers SL.

The lower semiconductor pattern LSP may be formed by a selective epitaxial growth (SEG) process, in which using the substrate 10 exposed by the vertical holes H and DH is used as a seed layer. Accordingly, the lower semiconductor pattern LSP may be a pillar shape structure, which is formed to fill the lower region of each of the vertical holes H and DH. In this case, the lower semiconductor pattern LSP may have a single-crystalline structure, or a poly-crystalline structure having a grain size greater than that of a semiconductor material formed by a CVD technique. The lower semiconductor pattern LSP may include silicon, but the inventive concepts are not limited thereto. For example, the lower semiconductor pattern LSP may include at least one of carbon nano structures, organic semiconductor materials, and compound semiconductor materials. Alternatively, the lower semiconductor pattern LSP may be formed of a poly-crystalline semiconductor material (e.g., poly-crystalline silicon).

The lower semiconductor pattern LSP may be formed to have the same conductivity type as the substrate 10. The lower semiconductor pattern LSP may be doped in situ during the selective epitaxial growth process. Alternatively, the lower semiconductor pattern LSP may be doped by an additional ion implantation process, after the formation of the lower semiconductor pattern LSP.

Figure 9A:
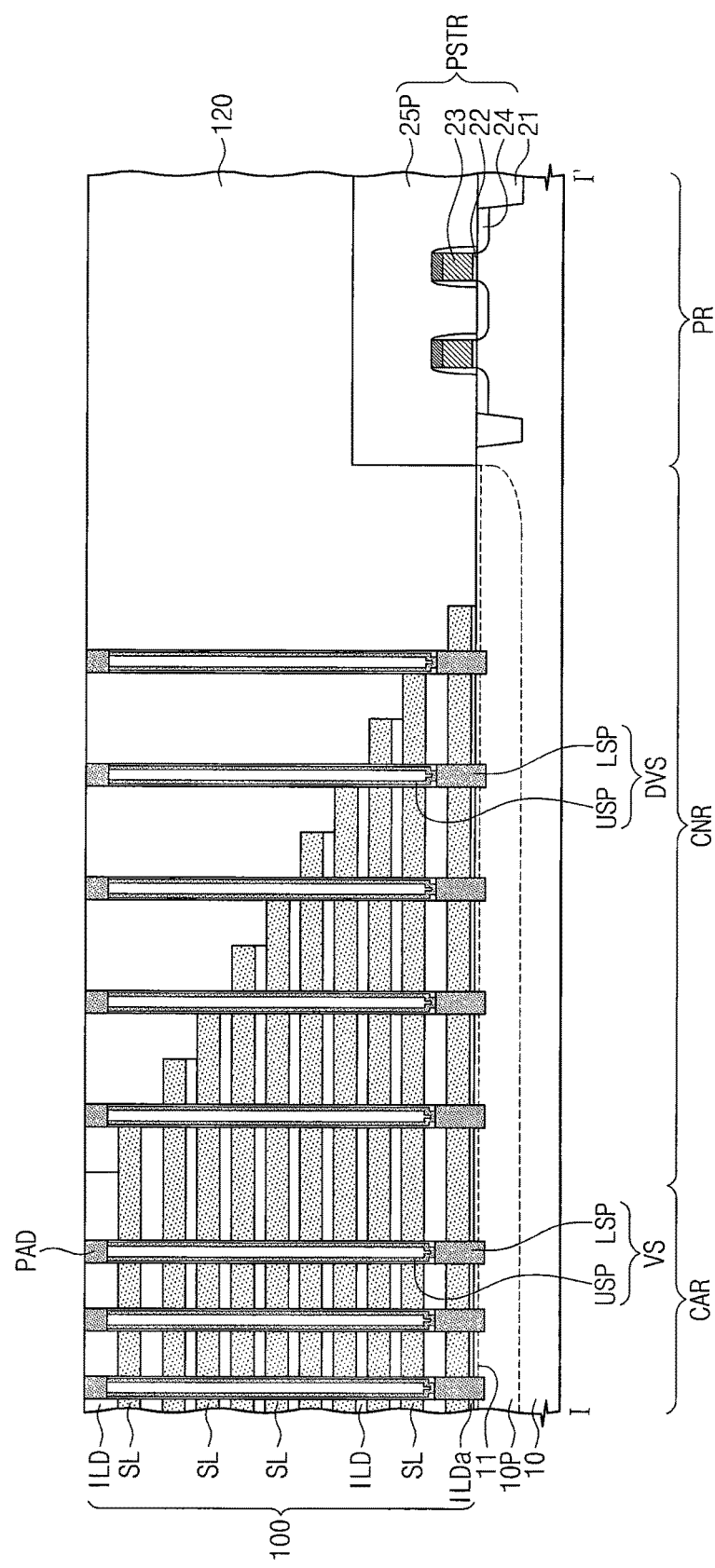
Figure 9B:
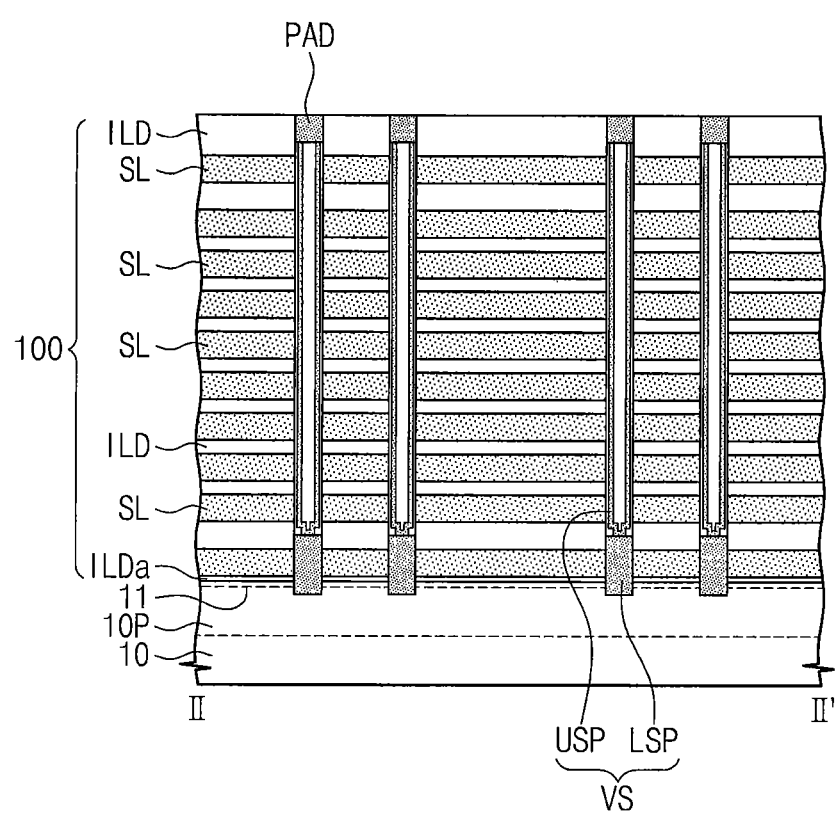

Referring to FIGS. 4, 9A, and 9B, upper semiconductor patterns USP may be formed in the vertical holes H and DH provided with the lower semiconductor pattern LSP. As a result, vertical structures VS may be formed in the cell vertical holes H, and dummy vertical structures DVS may be formed in the dummy vertical holes DH. Here, each of the vertical structures VS may include the lower semiconductor pattern LSP and the upper semiconductor pattern USP, and each of the dummy vertical structures DVS may include the lower semiconductor pattern LSP and the upper semiconductor pattern USP.

For example, as shown in FIGS. 15A and 15B, the upper semiconductor pattern USP may include a first semiconductor pattern SP1 and a second semiconductor pattern SP2. The first semiconductor pattern SP1 may be coupled to the lower semiconductor pattern LSP and may have a pipe or macaroni shape with closed bottom and open top. An inner space of the first semiconductor pattern SP1 may be filled with the insulating gap-fill pattern VI. In addition, the first semiconductor pattern SP1 may be in contact with an inner surface of the second semiconductor pattern SP2 and the top surface of the lower semiconductor pattern LSP. In other words, the first semiconductor pattern SP1 may allow the second semiconductor pattern SP2 to be electrically connected to the lower semiconductor pattern LSP. The second semiconductor pattern SP2 may be shaped like a hollow pipe or macaroni whose top and bottom are open. The second semiconductor pattern SP2 may be spaced apart from (i.e., non-contacting) the lower semiconductor pattern LSP. The first and second semiconductor patterns SP1 and SP2 may be in an undoped state or may be doped to have the same conductivity type as the substrate 10. The first and second semiconductor patterns SP1 and SP2 may be formed of or include at least one of doped or intrinsic semiconductor materials (e.g., of silicon Si, germanium Ge, or compounds thereof). Furthermore, the first and second semiconductor patterns SP1 and SP2 may be formed to have one of polycrystalline, amorphous, and single-crystalline structures. Each of the first and second semiconductor patterns SP1 and SP2 may be a poly silicon layer formed by one of ALD and CVD processes.

Conductive pads PAD may be formed on the upper semiconductor patterns USP, respectively. Each of the conductive pads PAD may be a doped impurity region or may be formed of a conductive material.

Furthermore, in some example embodiments, before the formation of the upper semiconductor pattern USP, a vertical insulating pattern VP may be formed in each of the vertical holes H and DH, as shown in FIGS. 15A and 15B. The vertical insulating pattern VP may include one or more layers. In some example embodiments, the vertical insulating pattern VP may serve as a part of the data storing layer. For example, the vertical insulating pattern VP may include a charge storing layer, which may serve as a memory element of a FLASH memory device. The charge storing layer may be a trap insulating layer or an insulating layer with conductive nanodots. In certain embodiments, the vertical insulating pattern may include at least one layer exhibiting a phase-changeable or variable resistance property.

Figure 10A:
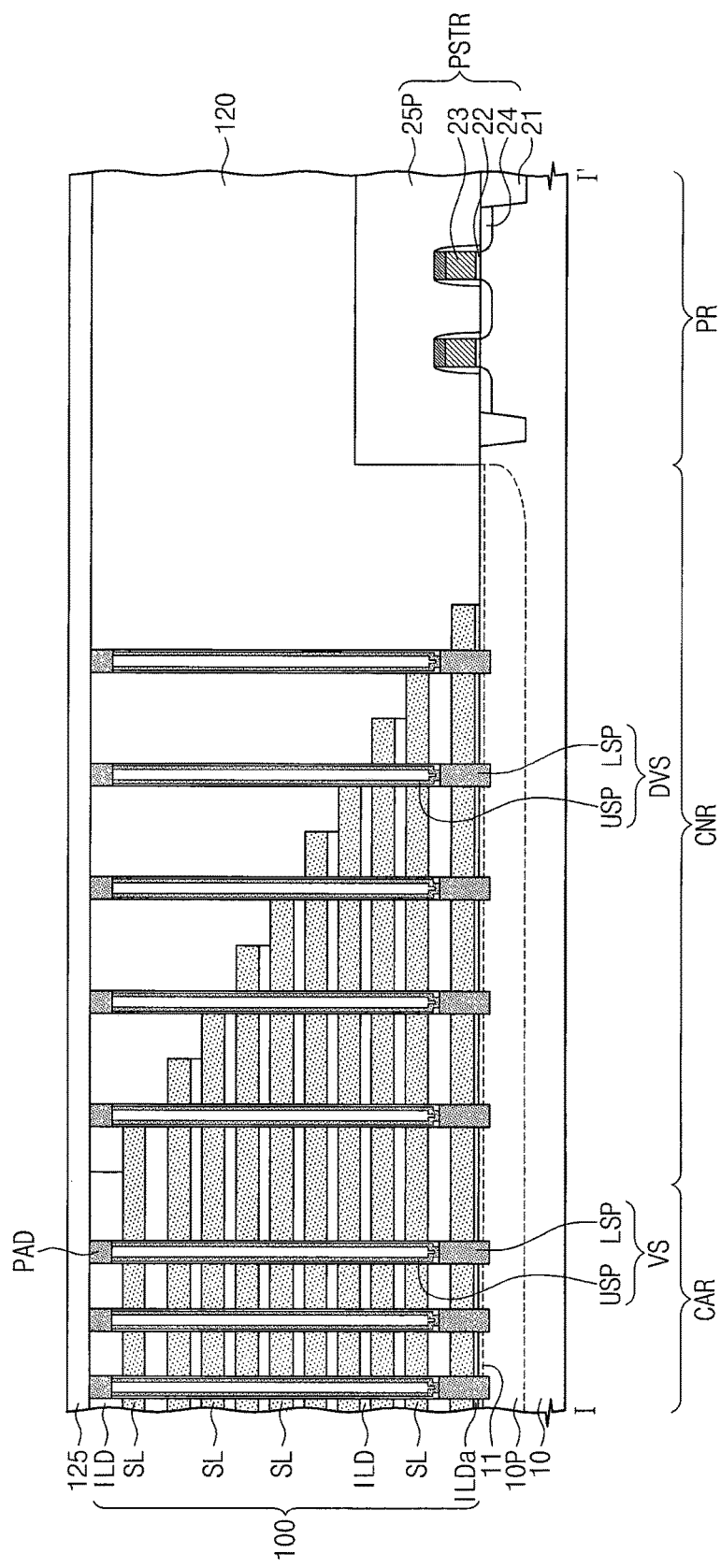
Figure 10B:
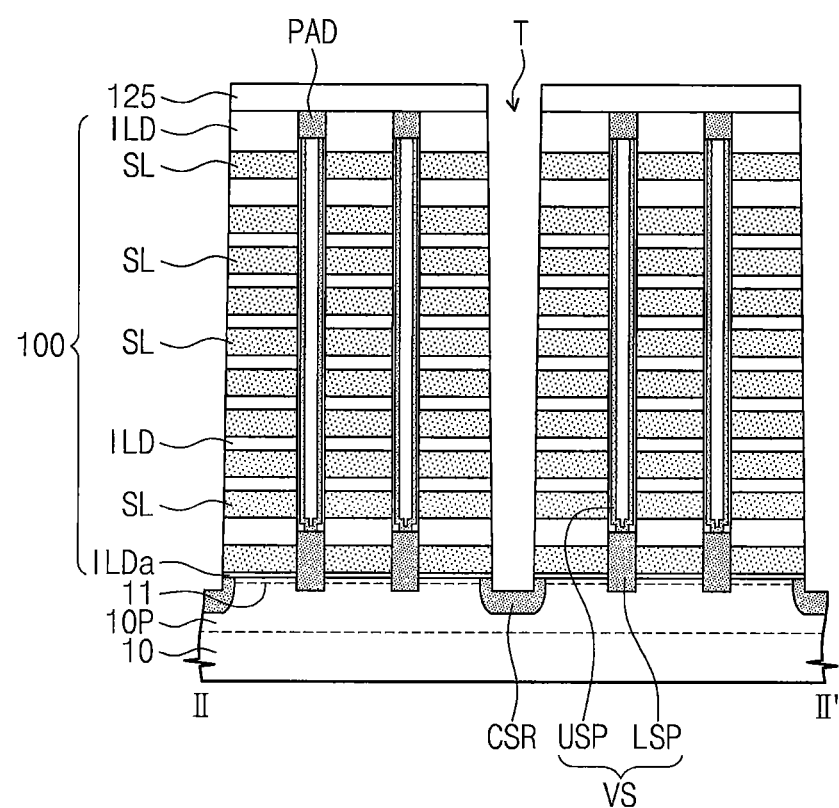

Referring to FIGS. 4, 10A, and 10B, a capping insulating layer 125 may be formed on the filling insulation layer 120 to cover top surfaces of the vertical structures VS and DVS. Next, the capping insulating layer 125 and the mold structure 100 may be patterned to form trenches T exposing the substrate 10.

For example, the formation of the trenches T may include forming a mask pattern on the mold structure 100 to define positions of the trenches T, and then, anisotropically etching the mold structure 100 using the mask pattern as an etch mask.

The trenches T may be formed to be spaced apart from the vertical structures VS and to expose sidewalls of the sacrificial layers SL and the insulating layers ILD. The trenches T may be formed to have a linear or a rectangular shape extending in a first direction D1, when viewed in a plan view, and also, the trenches T may be formed to expose the top surface of the substrate 10. The formation of the trenches T may be performed in an over-etching manner, and thus, the top surface of the substrate 10 exposed by the trenches T may be partially recessed. In some example embodiments, although the anisotropic etching process is used to form the trenches T, the trenches T may be formed to have an inclined or curved sidewall.

As a result of the formation of the trenches T, the mold structure 100 may have a plurality of line-shape portions extending in the first direction D1. Also, a plurality of the vertical structures VS may be provided to pass through each of the line-shaped portions of the mold structure 100.

In some example embodiments, after the formation of the trenches T, common source regions CSR may be formed in the substrate 10 exposed by the trenches T. The common source regions CSR may extend parallel to each other and in the first direction D1 and may be spaced apart from each other in a second direction D2. For example, the common source regions CSR may be formed in the well impurity layer 10P between the mold structures 100 and adjacent to the sidewalls of the mold structures 100. The common source regions CSR may be formed by doping the substrate 10 with impurities having a conductivity type different from that of the substrate 10. For example, the common source regions CSR may include n-type impurities (e.g., arsenic (As) or phosphorus P).

Figure 11A:
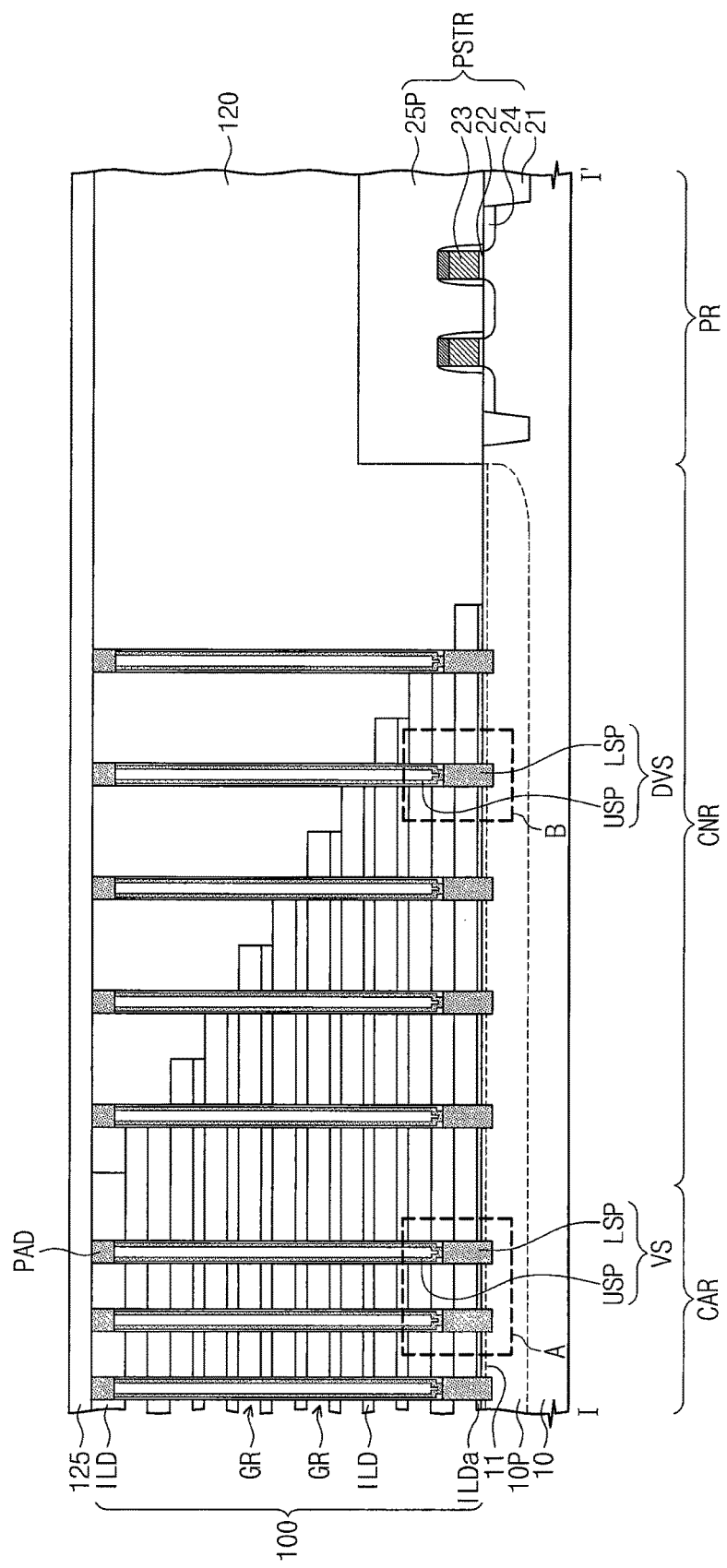
Figure 11B:
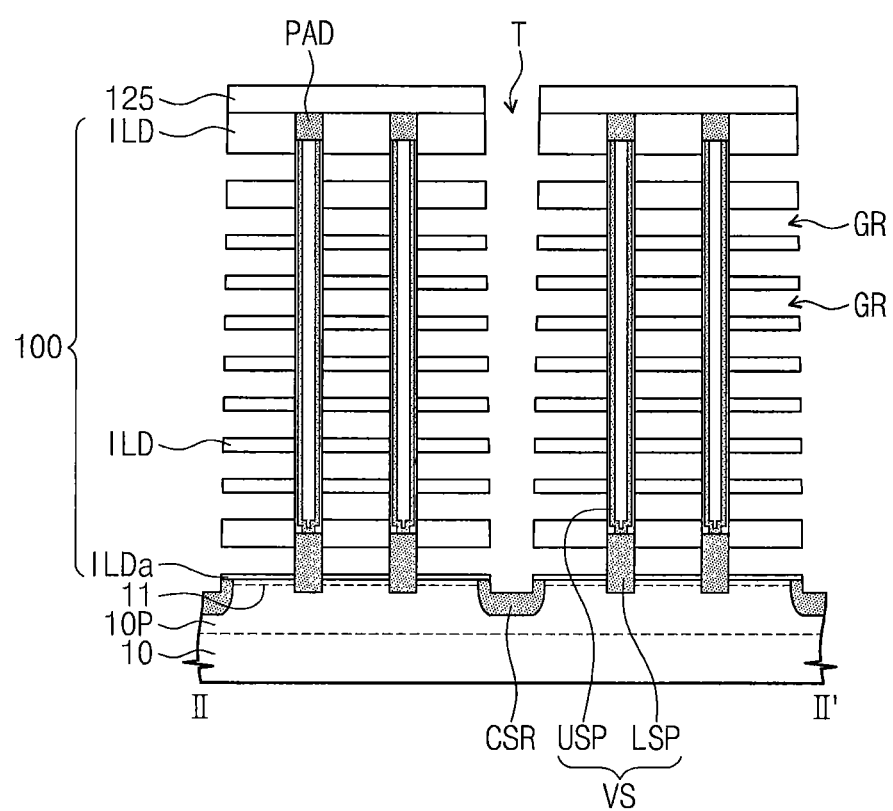

Referring to FIGS. 4, 11A, and 11B, the sacrificial layers SL exposed by the trenches T may be removed to form gate regions GR between the insulating layers ILD.

The formation of the gate regions GR may include isotropically etching the sacrificial layers SL using an etch recipe having an etch selectivity with respect to the buffer insulating layer ILDa, the insulating layers ILD, the vertical structures VS, and the substrate 10. Here, the sacrificial layers SL may be fully removed by the isotropic etching process. For example, in the case where the sacrificial layers SL are formed of a silicon nitride layer and the insulating layers ILD are formed of a silicon oxide layer, the etching step may be performed by an isotropic etching process using an etching solution containing phosphoric acid. Furthermore, the vertical insulating pattern VP may be used as an etch stop layer in the isotropic etching process for forming the gate regions GR. The gate regions GR may extend horizontally from the trench T and be formed between the insulating layers ILD. Accordingly, a sidewall of the vertical insulating pattern VP or the vertical structure VS may be partially exposed by the gate regions GR. In other words, each of the gate regions GR may be defined by vertically adjacent ones of the insulating layers ILD and the sidewall of the vertical insulating pattern VP.

In some example embodiments, as shown in FIGS. 15A and 15B, the lowermost one of the gate regions GR may be formed to expose a portion of the sidewall of the lower semiconductor pattern LSP and to expose the buffer insulating layer ILDa. As shown in FIGS. 15A and 15B, the buffer insulating layer ILDa exposed by the gate region GR may have a first thickness t1, after the formation of the gate regions GR. In some example embodiments, the first thickness t1 may be greater than or equal to a thickness of the oxidation suppressing layer 11.

Figure 12A:
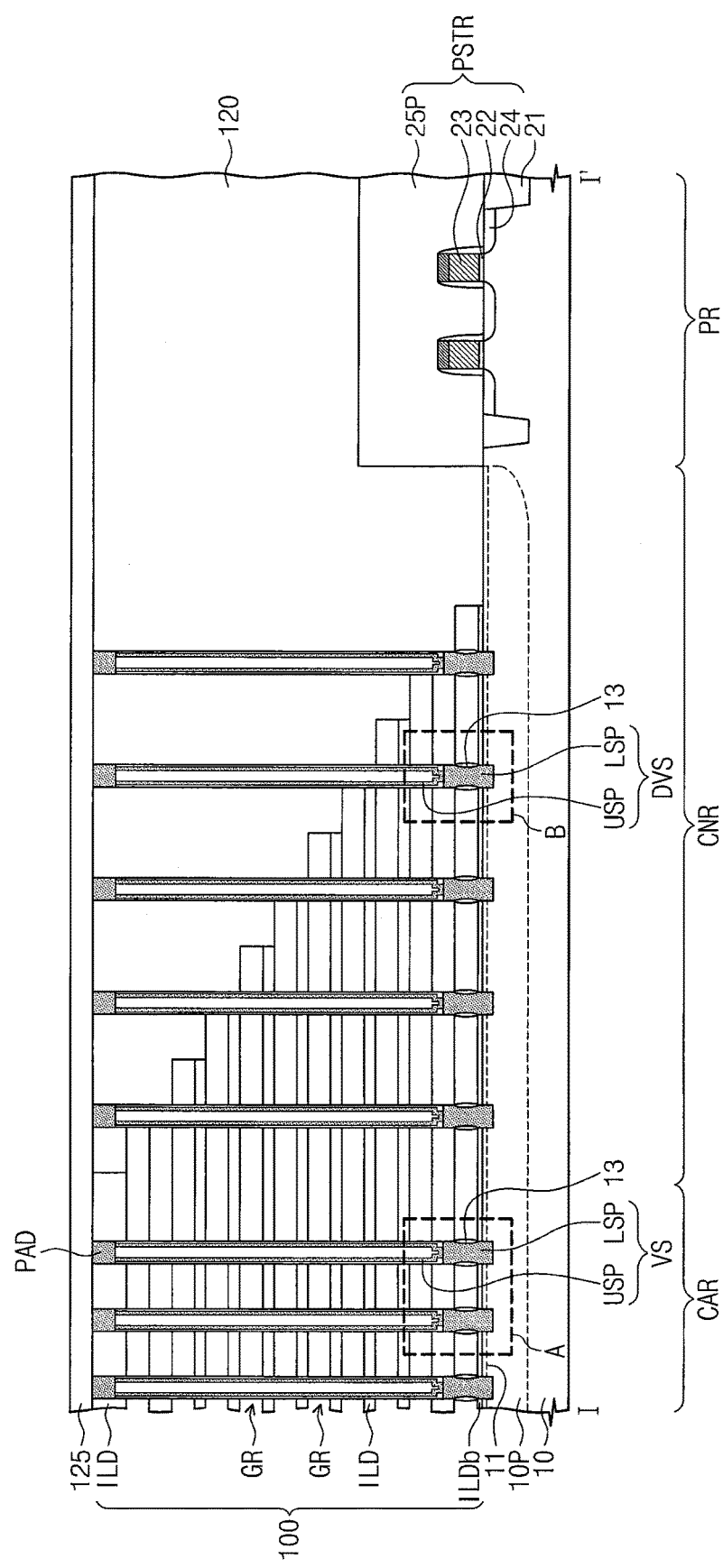
Figure 12B:
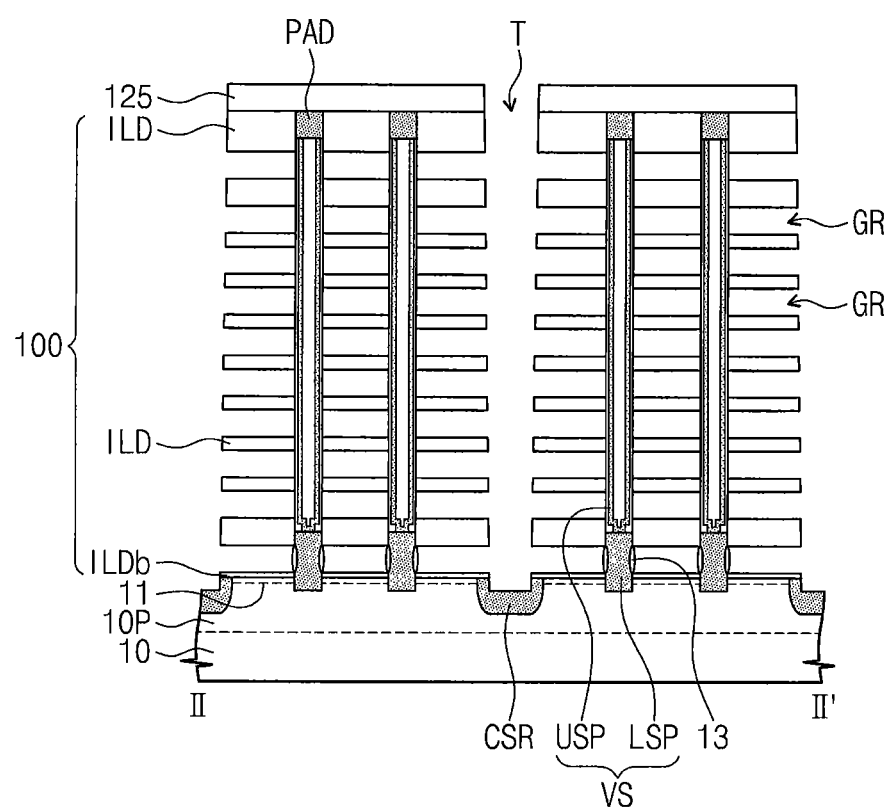

Referring to FIGS. 4, 12A, and 12B, a vertical gate insulating layer 13 may be formed on the sidewall of the lower semiconductor pattern LSP exposed by the gate region GR, and a horizontal gate insulating layer ILDb may be formed on the surface of the oxidation suppressing layer 11.

In some example embodiments, the vertical gate insulating layer 13 and the horizontal gate insulating layer ILDb may be formed by a thermal treatment process, in which an oxygen-containing gas is used as an ambient gas. In this case, the vertical gate insulating layer 13 and the horizontal gate insulating layer ILDb may be selectively formed on a surface, depending on whether a surface includes silicon atoms to promote a reaction with the oxygen-containing gas.

For example, referring to FIGS. 16A and 16B, the vertical gate insulating layer 13 may be formed by a chemical reaction between oxygen atoms, which are supplied during the thermal oxidation process, and silicon atoms, which are present on the lower semiconductor pattern LSP. In other words, silicon atoms of the lower semiconductor pattern LSP exposed by the gate region GR may be consumed during the thermal oxidation process. Accordingly, after the formation of the vertical gate insulating layer 13, the lower semiconductor pattern LSP may be narrower at a middle portion that is exposed by the gate region GR compared to an upper portion in contact with the insulating layer. In addition, the vertical gate insulating layer 13 may have a rounded surface.

The horizontal gate insulating layer ILDb may be formed by a chemical reaction between oxygen atoms, which are supplied during the thermal oxidation process, and silicon atoms of the substrate 10, because the buffer insulating layer ILDa is thin enough to allow oxygen atoms to pass therethrough during the thermal oxidation process. Accordingly, silicon atoms of the substrate 10 under the buffer insulating layer ILDa may be consumed to allow the buffer insulating layer ILDa to have an increased thickness, and as a result, the horizontal gate insulating layer ILDb may be formed on the substrate 10. In other words, as shown in FIGS. 16A and 16B, the horizontal gate insulating layer ILDb may have a second thickness t2 that is greater than the first thickness t1 (e.g., shown in FIGS. 15A and 15B) of the buffer insulating layer ILDa before the thermal oxidation process. For example, the second thickness t2 may be greater than the thickness of the oxidation suppressing layer 11. The second thickness t2 may be less than a thickness of each of the insulating layers ILD. Also, the second thickness t2 may be substantially equal to the thickness of the vertical gate insulating layer 13. For example, the second thickness t2 of the horizontal gate insulating layer ILDb may range from about 100 Å to about 150 Å.

In some example embodiments, the buffer insulating layer ILDa may contact the oxidation suppressing layer 11, and in this case, due to the oxidation suppressing material in the oxidation suppressing layer 11, it is possible to suppress silicon atoms of the substrate 10 from being consumed during the thermal oxidation process for forming the vertical gate insulating layer 13. Accordingly, it is possible to reduce a difference in thickness of the horizontal insulating layer between the cell array region CAR and the connection region CNR.

In more detail, a structural difference of the mold structure 100 in the cell array region CAR compared to that of the connection region CNR may lead to a difference in amount of oxygen atoms, which will be supplied into the substrate 10 during the thermal oxidation process, between the cell array region CAR and the connection region CNR. For example, since the mold structure 100 having a stepwise structure and the filling insulation layer 120 is disposed on the connection region CNR, an amount of oxygen atoms supplied into the substrate 10 of the connection region CNR during the thermal oxidation process may be less than an amount of oxygen atoms supplied into the substrate 10 of the cell array region CAR. Accordingly, the thickness of the horizontal gate insulating layer ILDb may be greater in the cell array region CAR than in the connection region CNR, but due to the presence of the oxidation suppressing layer 11, it is possible to suppress oxidation of the substrate 10 on the cell array region CAR and the connection region CNR and thereby to reduce a difference in thickness of the horizontal gate insulating layer ILDb between the cell array region CAR and the connection region CNR. In some example embodiments, on the cell array region CAR and the connection region CNR, the horizontal gate insulating layer ILDb may have a substantially uniform thickness (e.g., the second thickness t2). In certain embodiments, the horizontal gate insulating layer ILDb may be thicker on the cell array region CAR than on the connection region CNR.

Furthermore, since oxygen atoms are supplied to the gate region GR through the trenches T during the thermal oxidation process, a thickness of a portion of the horizontal gate insulating layer ILDb adjacent to the trenches T may be different from that of another portion adjacent to the sidewall of the lower semiconductor pattern LSP. For example, the horizontal gate insulating layer ILDb may have a thickness that decreases in a direction from the trench T toward the lower semiconductor pattern LSP. However, according to some example embodiments of the inventive concepts, since the oxidation suppressing layer 11 reduces the consumption of silicon atoms of the substrate 10 during thermal oxidation process, it is possible to reduce a difference in thickness between the portions of the horizontal gate insulating layer ILDb, which are positioned adjacent to the trench T and the lower semiconductor pattern LSP, respectively.

Moreover, since, during the formation of the vertical gate insulating layer 13 and the horizontal gate insulating layer ILDb, the vertical insulating pattern VP on the upper semiconductor pattern USP is exposed by the gate regions GR, a silicon oxide layer may not be formed in the gate regions GR adjacent to the upper semiconductor pattern USP.

Figure 13A:
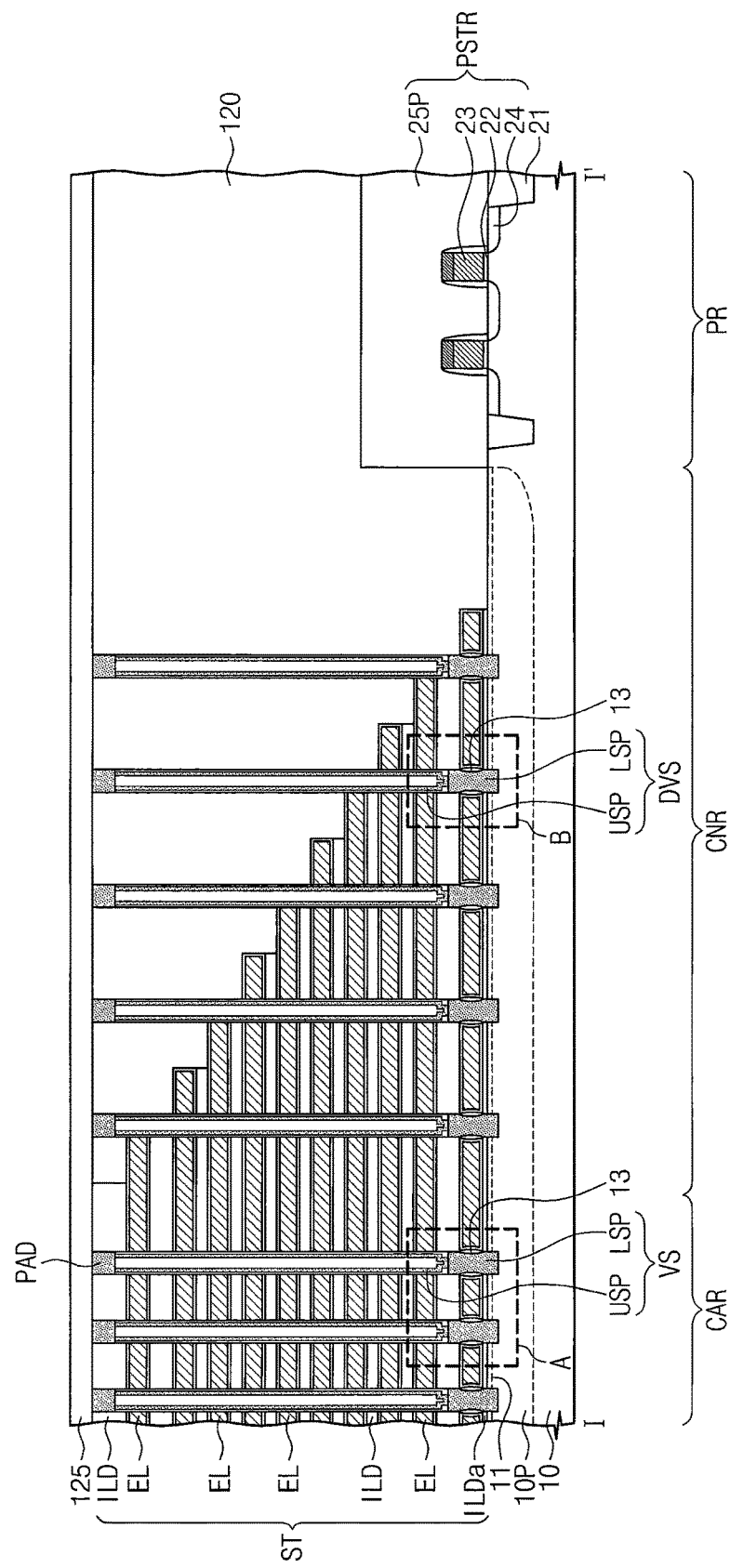
Figure 13B:
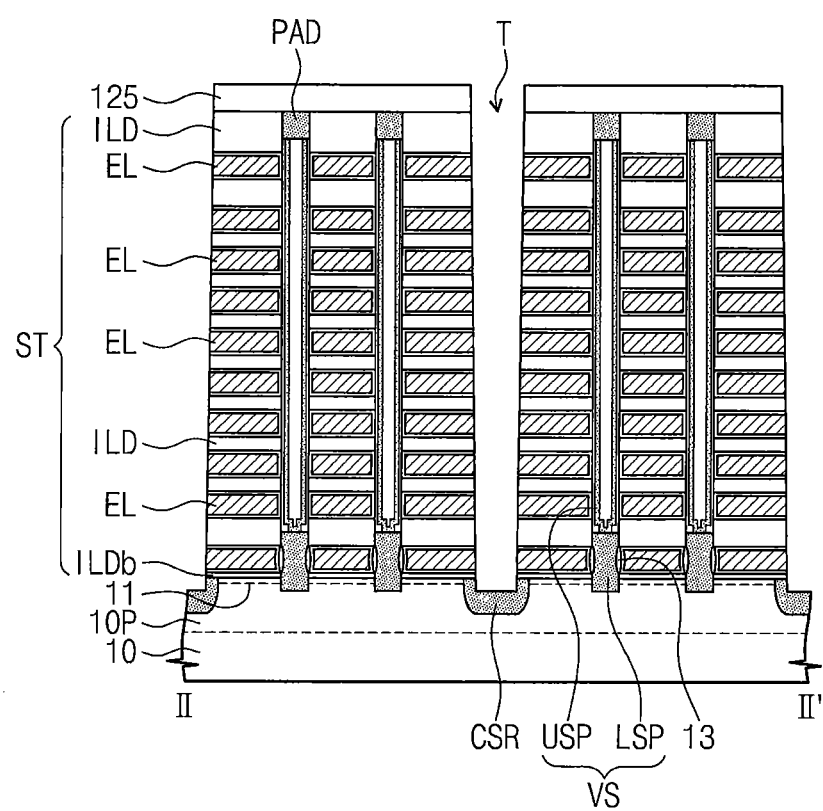

Referring to FIGS. 4, 13A, and 13B, a horizontal insulating pattern HP may be formed to conformally cover inner surfaces of the gate regions GR. Referring to FIGS. 17A, 17B, and 18, the horizontal insulating pattern HP may be formed to have a substantially uniform thickness on the inner surfaces of the gate regions GR. The horizontal insulating pattern HP may be formed to have a single- or multi-layered structure. In a charge-trap type FLASH memory device, the horizontal insulating pattern HP may serve as a part of a data storing element of a memory transistor.

Thereafter, electrodes EL may be formed in the gate regions GR provided with the horizontal insulating pattern HP. The electrodes EL may be formed to partially or wholly fill the gate regions GR.

The formation of the electrodes EL may include forming a gate conductive layer to fill the gate regions GR provided with the horizontal insulating pattern HP and then removing the gate conductive layer from the trenches T to form the electrodes EL in the gate regions GR, respectively. Here, the formation of the electrodes EL may include sequentially depositing a barrier metal layer and a metal layer. The barrier metal layer may be formed of or include at least one of metal nitride materials (e.g., TiN, TaN, or WN). The metal layer may be formed of or include at least one of metallic materials (e.g., W, Al, Ti, Ta, Co, or Cu).

As a result of the formation of the electrodes EL, the insulating layers ILD and the electrodes EL may be alternately and vertically stacked on the substrate 10, thereby forming the stacks ST. The stacks ST may extend in the first direction D1 and may have the sidewalls exposed by the trenches T. The substrate 10 may be partially exposed between adjacent ones of the stacks ST.

In the stacks ST, the lowermost one of the electrodes EL may be adjacent to (and function with) the lower semiconductor patterns LSP of the vertical structures VS and DVS, as shown in FIG. 18. Here, a distance Da between the sidewalls of the lower semiconductor pattern LSP and the lowermost one of the electrodes EL adjacent thereto may be substantially equal to a distance Db between the bottom surface of the lowermost one of the electrodes EL and the top surface of the oxidation suppressing layer 11.

Figure 14A:
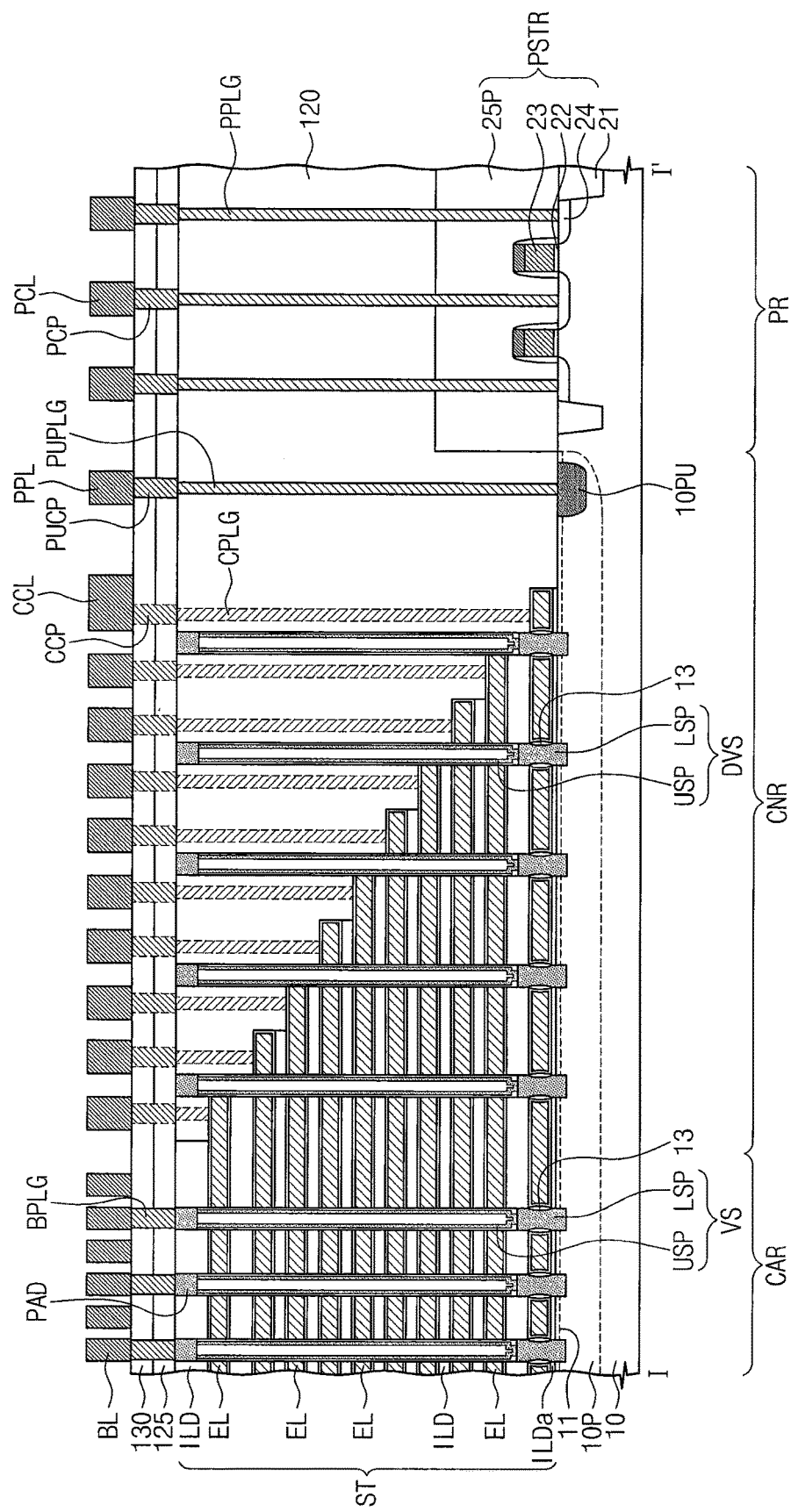
Figure 14B:
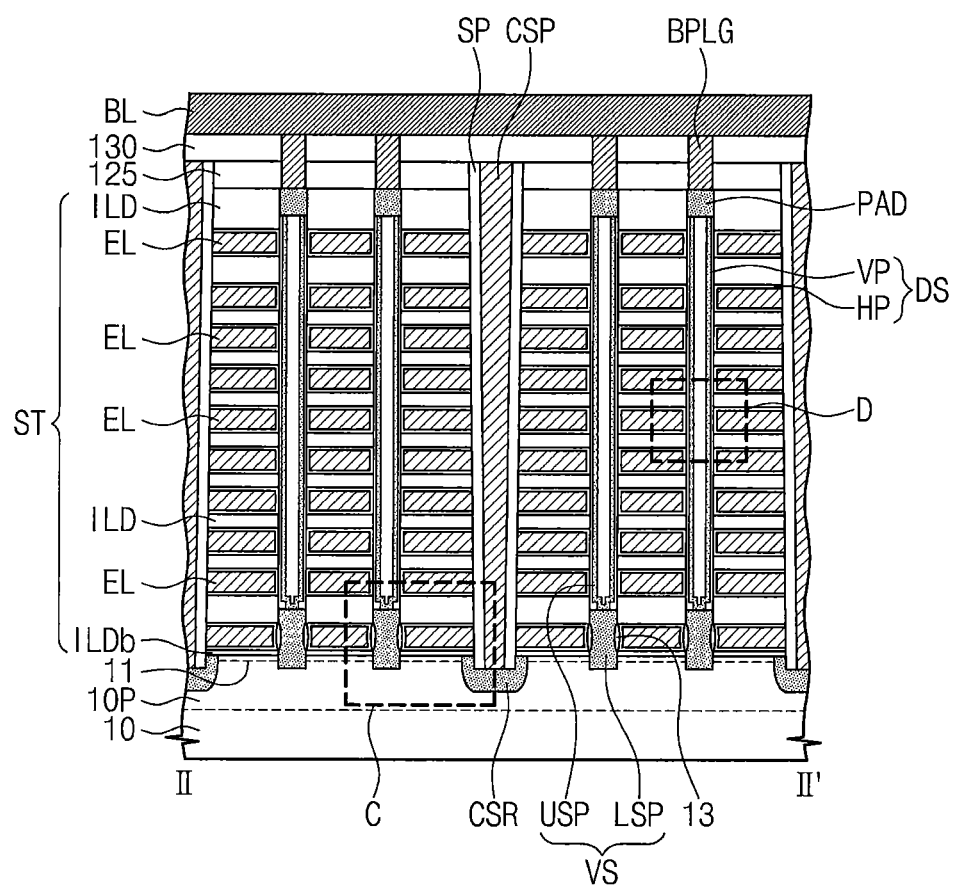

Thereafter, as shown in FIGS. 4, 14A, and 14B, an insulating spacer SP may be formed to cover sidewalls of the trenches T. The formation of the insulating spacer SP may include conformally depositing a spacer layer on the substrate 10 provided with the stacks ST, and performing an etch-back process on the spacer layer to expose the common source region CSR. Here, the spacer layer may be formed of an insulating material and may be formed on the inner surfaces of the trenches T to have a thickness less than about half the minimum width of the trench T. The spacer layer may be formed of at least one of silicon oxide, silicon nitride, silicon oxynitride, or low-k dielectric materials.

A common source plug CSP may be formed in each trench T provided with the insulating spacer SP. In some example embodiments, the common source plug CSP may be provided between adjacent ones of the electrodes EL, and the insulating spacer SP may be interposed between the electrodes EL and the common source plug CSP. In other words, the insulating spacer SP may be provided to cover both sidewalls of the common source plug CSP. Also, the common source plug CSP may extend parallel to the electrodes EL, and the common source plug CSP may have a top surface positioned at a higher level than the top surfaces of the vertical structures VS.

Thereafter, referring to FIGS. 4, 14A, and 14B, an upper insulating layer 130 may be formed on the capping insulating layer 125 to cover the top surface of the common source plug CSP. Next, bit line contact plugs BPLG may be formed to pass through the capping insulating layer 125 and the upper insulating layer 130. The bit line contact plugs BPLG may be coupled to the vertical structures VS, respectively. In addition, bit lines BL extending in the second direction D2 may be formed on the upper insulating layer 130. Each of the bit lines BL may be coupled to the bit line contact plugs BPLG.

Furthermore, contact plugs CPLG, CCP, PUPLG, PPLG, and PCP may be formed on the connection region CNR and the peripheral circuit region PR to electrically connect the electrodes EL to the peripheral logic circuits.

The cell contact plugs CPLG may be formed on the connection region CNR to pass through the capping insulating layer 125 and the filling insulation layer 120, and each of the cell contact plugs CPLG may be coupled to a corresponding one of the end portions of the electrodes EL. Vertical lengths of the cell contact plugs CPLG may decrease with decreasing distance from the cell array region CAR. Top surfaces of the cell contact plugs CPLG may be substantially coplanar with each other. The pick-up contact plug PUPLG may be formed to pass through the filling insulation layer 120 and may be coupled to a pick-up region 10PU. Here, the pick-up region 10PU may be doped to have the first conductivity type, and a doping concentration of the pick-up region 10PU may be higher than that of the well impurity layer 10P. The pick-up contact plugs PUPLG may have top surfaces that are positioned at substantially the same level as the top surfaces of the cell contact plugs CPLG. The peripheral contact plugs PPLG may be formed on the peripheral circuit region PR to pass through the filling insulation layer 120 and the peripheral insulating pattern 25P and may be electrically coupled to the peripheral logic circuits.

Connection lines CCL may be formed on the upper insulating layer 130 of the connection region CNR, and may be connected to the cell contact plugs CPLG via first contact plugs CCP. Peripheral lines PCL may be formed on the upper insulating layer 130 of the peripheral circuit region PR, and may be connected to the peripheral contact plugs PPLG via second contact plugs PCP. Also, a well conductive line PPL may be formed on the upper insulating layer 130 of the connection region CNR, and may be connected to the pick-up contact plug PUPLG via third contact plugs PUCP.

Hereinafter, some examples of possible structures of a data storing layer according to some example embodiments of the inventive concepts will be described in more detail with reference to FIGS. 20A to 20E.

In some example embodiments, the three-dimensional semiconductor memory device may be a NAND FLASH memory device. For example, a data storing layer DS may be interposed between the stack ST and the vertical structure VS and may include a tunnel insulating layer TIL, a charge storing layer CIL, and a blocking insulating layer BLK. Data stored in the data storing layer DS may be changed using a Fowler-Nordheim FN tunneling effect, which may be caused by a voltage difference between the vertical structure VS and the electrode EL.

Figure 20A:
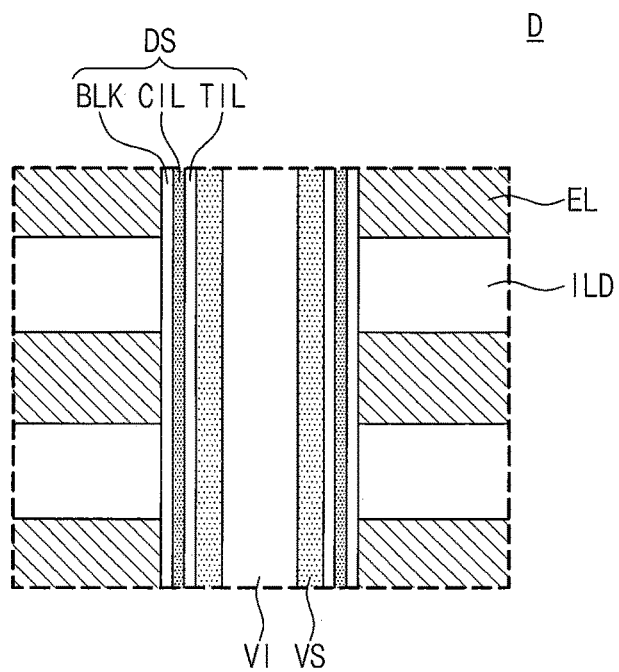
FIGS. 20A to 20E are enlarged sectional views, each of which illustrates a portion 'D' of FIG. 14B and illustrate a data storing layer of a three-dimensional semiconductor memory device according to some example embodiments of the inventive concepts.

According to an example embodiment shown in FIG. 20A, the tunnel insulating layer TIL, the charge storing layer CIL, and the blocking insulating layer BLK may be vertically extended from regions between the electrodes EL and the vertical structure VS to adjacent regions between the insulating layer ILD and the vertical structure VS. In this case, the insulating layer ILD may contact the electrode EL.

Figure 20B:
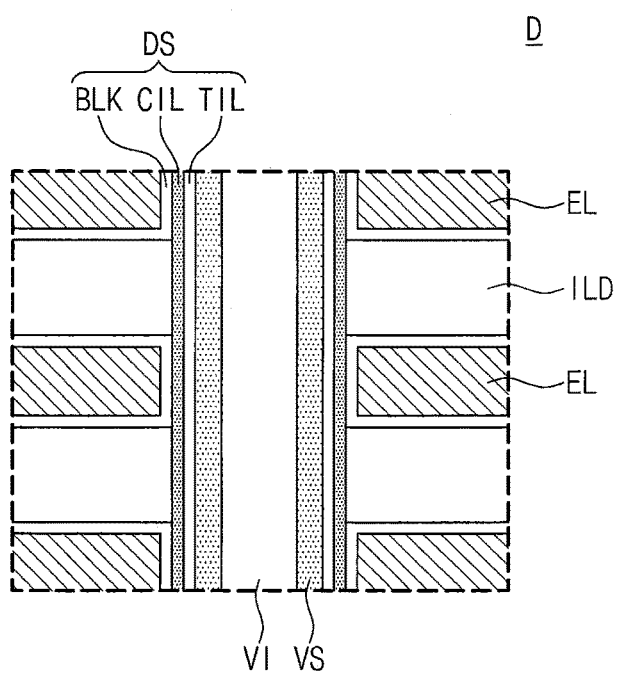

According to an example embodiment shown in FIG. 20B, the tunnel insulating layer TIL and the charge storing layer CIL may be vertically extended from regions between the electrodes EL and the vertical structure VS to adjacent regions between the insulating layer ILD and the vertical structure VS. The blocking insulating layer BLK may be horizontally extended from the regions between the electrodes EL and the vertical structure VS to cover top and bottom surfaces of the electrodes EL.

Figure 20C:
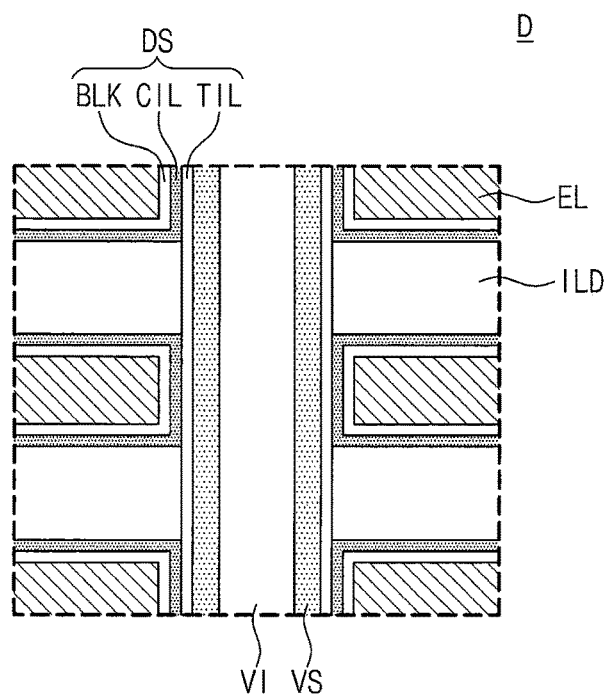

According to an example embodiment shown in FIG. 20C, the tunnel insulating layer TIL may be vertically extended from the regions between the electrodes EL and the vertical structure VS to the adjacent regions between the insulating layer ILD and the vertical structure VS, and the charge storing layer CIL and the blocking insulating layer BLK may be horizontally extended from the regions between the electrodes EL and the vertical structure VS to cover the top and bottom surfaces of the electrodes EL.

Figure 20D:
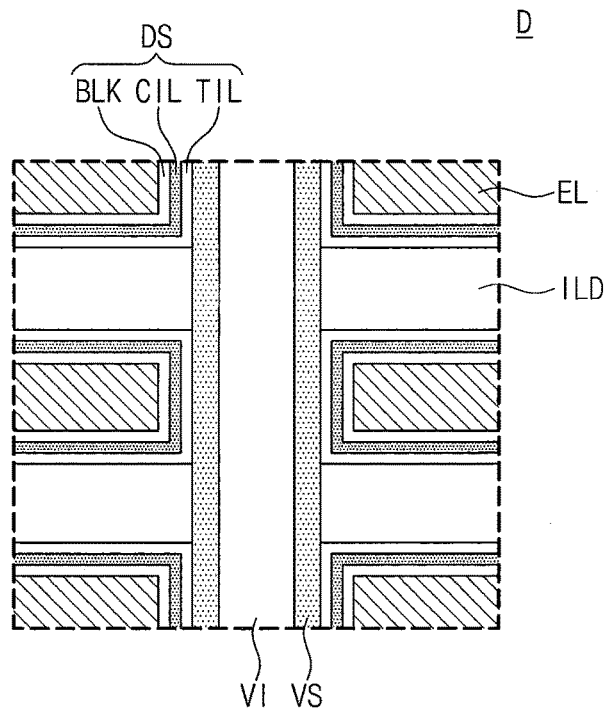

According to an example embodiment shown in FIG. 20D, the tunnel insulating layer TIL, the charge storing layer CIL, and the blocking insulating layer BLK may be horizontally extended from the regions between the electrodes EL and the vertical structure VS to cover the top and bottom surfaces of the electrodes EL.

Figure 20E:
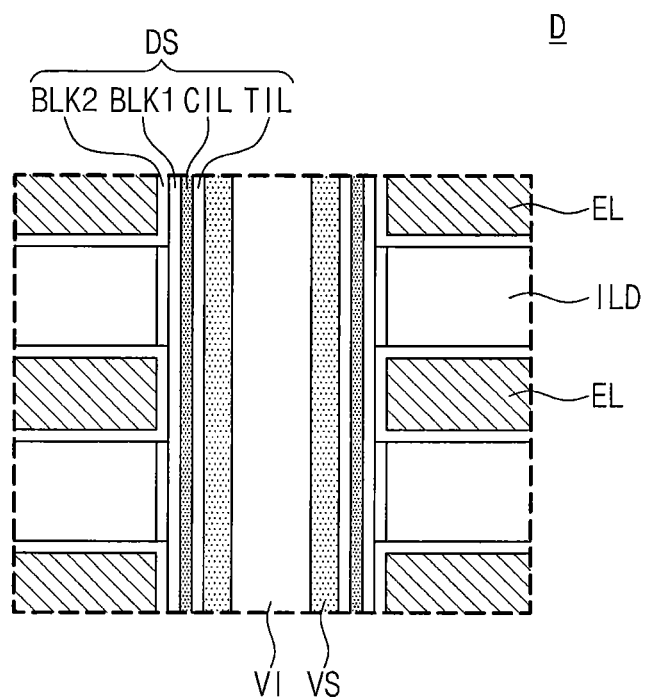

According to an example embodiment shown in FIG. 20E, the data storing layer DS may include first and second blocking insulating layers BLK1 and BLK2, which are formed of different materials. The tunnel insulating layer TIL, the charge storing layer CIL, and the first blocking insulating layer BLK1 may be vertically extended from the regions between the electrodes EL and the vertical structure VS to the adjacent regions between the insulating layer ILD and the vertical structure VS. The second blocking insulating layer BLK2 may be horizontally extended from the regions between the electrodes EL and the first blocking insulating layer BLK1 to cover the top and bottom surfaces of the electrodes EL.

The data storing layer shown in FIGS. 20A to 20E, the charge storing layer CIL may be one of an insulating layer with many trap sites and an insulating layer with nano particles and may be formed by a CVD or ALD process. For example, the charge storing layer CIL may be formed of or include a trap insulating layer, a floating gate electrode, or an insulating layer including conductive nano dots. In certain embodiments, the charge storing layer CIL may be formed of or include at least one of a silicon nitride layer, a silicon oxynitride layer, a silicon-rich nitride layer, a nanocrystalline silicon layer, or a laminated trap layer.

The tunnel insulating layer TIL may be one of materials having a greater band gap than the charge storing layer CIL and be formed by a CVD or ALD process. For example, the tunnel insulating layer TIL may be a silicon oxide layer, which may be formed by one of the afore-described deposition techniques. Alternatively, the tunnel insulating layer TIL may be formed of or include one of high-k dielectrics (e.g., aluminum oxide and hafnium oxide).

The blocking insulating layer BLK may be one of materials, whose band gaps are smaller than that of the tunnel insulating layer TL and larger than that of the charge storing layer CL. The blocking insulating layer BLK may include at least one of high-k dielectrics (e.g., aluminum oxide and hafnium oxide). The blocking insulating layer BLK may be formed by a CVD or ALD process and may be formed by a wet oxidation process.

As shown in FIG. 20E, in the case where the data storing layer DS includes the first and second blocking insulating layers BLK1 and BLK2, the first blocking insulating layer BLK1 may be formed of or include at least one of high-k dielectric materials (e.g., aluminum oxide and hafnium oxide) and the second blocking insulating layer BLK2 may be formed of or include a material, whose dielectric constant is less than that of the first blocking insulating layer BLK1. In certain embodiments, the second blocking insulating layer BLK2 may be formed of or include at least one of high-k dielectric materials, and the first blocking insulating layer BLK1 may be formed of or include a material, whose dielectric constant is lower than that of the second blocking insulating layer BLK2.

Data stored in the data storing layer DS of FIGS. 20A to 20E may be changed using a Fowler-Nordheim FN tunneling effect, which may be caused by a voltage difference between the vertical structure VS and the electrode EL. In certain embodiments, the data storing layer DS may include a layer (for example, exhibiting a phase-changeable or variable resistance property), which is configured to store data therein based on other physical effect.

Figure 21:
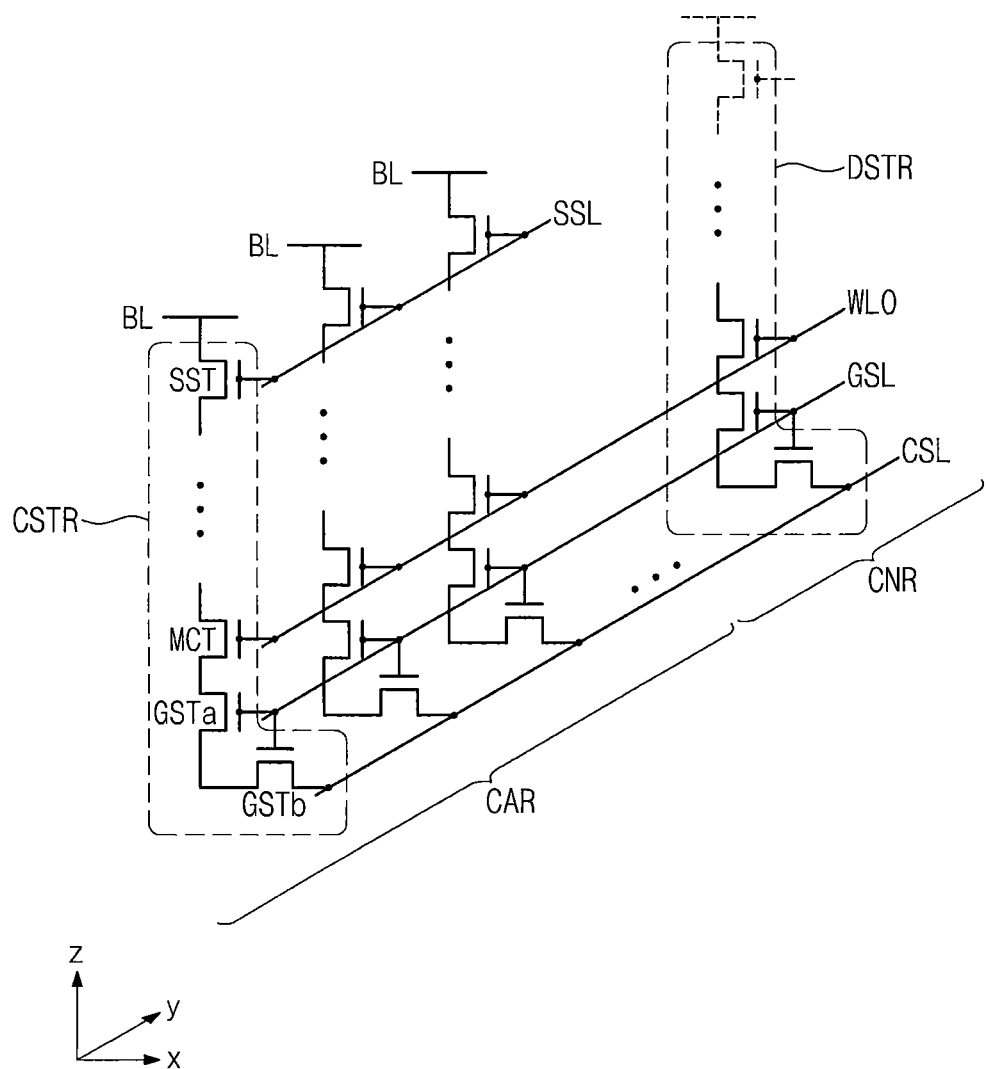
FIG. 21 is a circuit diagram illustrating a portion of a three-dimensional semiconductor memory device according to some example embodiments of the inventive concepts.

FIG. 21 is a circuit diagram illustrating a portion of a three-dimensional semiconductor memory device according to some example embodiments of the inventive concepts. In a three-dimensional semiconductor memory device according to some example embodiments of the inventive concepts, a cell array region may include memory cells that are three-dimensionally arranged on a substrate, as shown in FIG. 3. A portion of such a cell array region is exemplarily illustrated in FIG. 20, in order to reduce complexity in the drawings and to provide better understanding of some example embodiments of the inventive concepts.

Referring to FIG. 21, the string selection line SSL may be the uppermost one of the electrodes EL described with reference to FIGS. 14A and 14B. The uppermost ones of the electrodes EL may serve as gate electrodes of the string selection transistors SST for controlling electric connection between the bit line BL and the vertical structures VS.

The ground selection line GSL may be the lowermost one of the electrodes EL described with reference to FIGS. 14A and 14B. The lowermost ones of the electrodes EL may serve as gate electrodes of the ground selection transistors GSTa and GSTb for controlling electric connection between the common source region CSR and the vertical structures VS. In some example embodiments, each of the ground selection transistors GSTa and GSTb may consist of a pair of transistors, which are connected in series to each other and have gate electrodes connected to a single ground selection line. For example, each ground selection transistor may include a vertical transistor GSTa, in which the lower semiconductor pattern LSP of the vertical structure VS is used as a channel region thereof, and a horizontal transistor GSTb, in which the substrate 10 adjacent to the lower semiconductor pattern LSP is used as a channel region thereof.

The word lines WL may be some of the electrodes EL, which are provided between the uppermost and lowermost ones of the electrodes EL described with reference to FIGS. 14A and 14B. The word lines WL, in conjunction with the vertical structures VS, may constitute the memory cells MCT.

In some example embodiments, the word lines WL and the ground selection line GSL may be extended from the cell array region CAR to the connection region CNR. Furthermore, on the connection region CNR, the dummy vertical structures DVS may pass through the stacks ST, as shown in FIGS. 14A and 14B. Accordingly, similar to the cell strings CSTR of the cell array region CAR, dummy strings DSTR may be provided on the connection region CNR. On the connection region CNR, each of the dummy strings DSTR may be some of the word lines WL and the ground selection line GSL, in conjunction with each of the dummy vertical structures DVS described with reference to FIGS. 14A and 14B. Here, the dummy strings DSTR may be electrically isolated from the bit lines.

In some example embodiments, the horizontal transistor GSTb of the cell string CSTR and the horizontal transistor GSTb of the dummy string DSTR may be electrically connected in common to a single ground selection line GSL. The ground selection line GSL may be the lowermost one of the electrodes EL described with reference to FIGS. 14A and 14B. The ground selection line GSL may be used to control an electric potential of the substrate 10, and the horizontal transistors GSTb may have a threshold voltage that is dependent on the thickness of the horizontal gate insulating layer ILDb described with reference to FIGS. 14A and 14B. In some example embodiments, the horizontal gate insulating layer ILDb may be in contact with the oxidation suppressing layer 11, and thus, the horizontal gate insulating layer ILDb may have substantially the same thickness on the cell array region CAR and the connection region CNR. In other words, it is possible to reduce a difference in thickness between two portions of the horizontal gate insulating layer ILDb, which are formed on the cell array region CAR and the connection region CNR, respectively. As a result, it is possible to reduce a variation in threshold voltage of the ground selection transistors, which are provided on the cell array region CAR and the connection region CNR, respectively, and are connected in common to the ground selection line GSL.

Figure 19A:
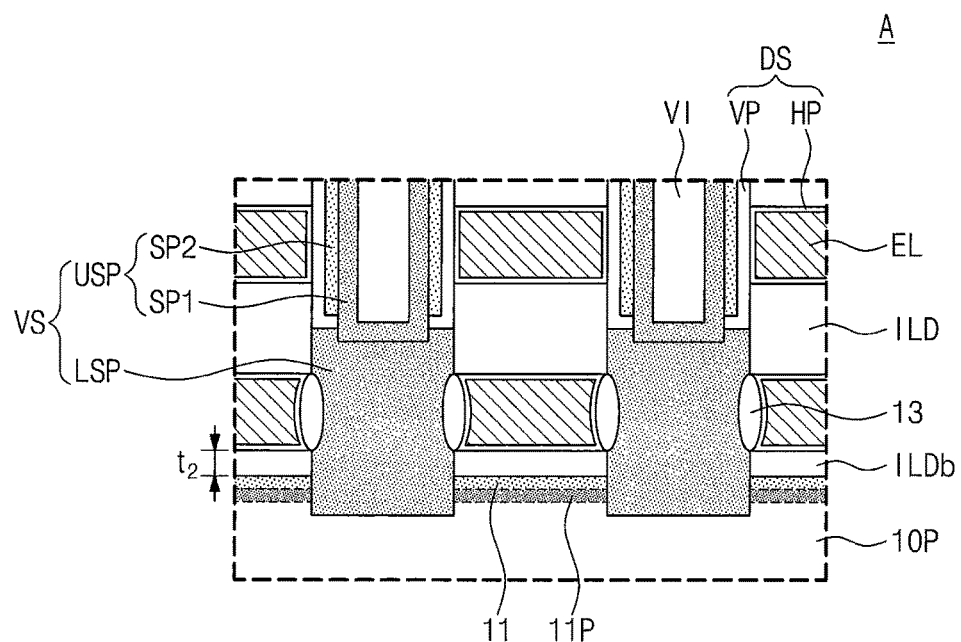
FIGS. 19A and 19B are enlarged sectional views illustrating portions 'A' and 'B' respectively, which are taken along lines I-I' and II-II', respectively, to illustrate a three-dimensional semiconductor memory device according to some example embodiments of the inventive concepts.
Figure 19B:
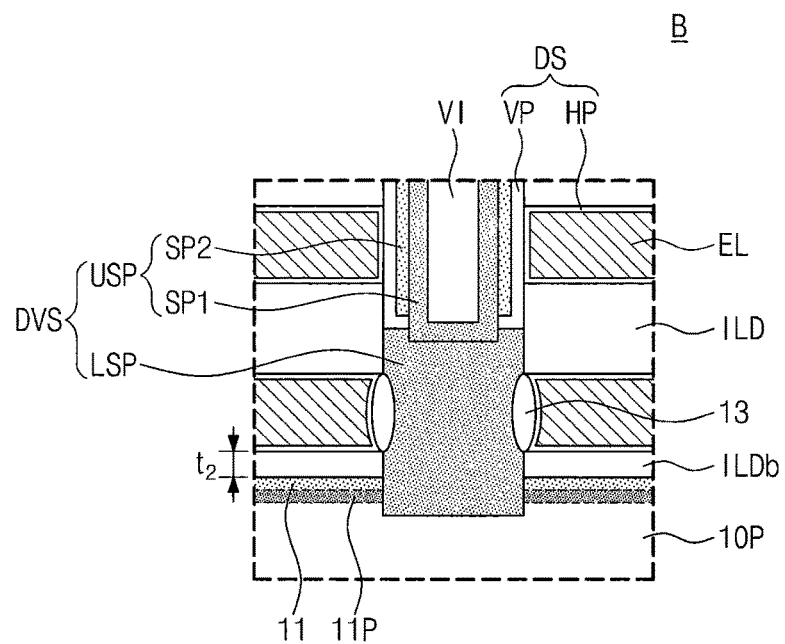

FIGS. 19A and 19B are views of portions 'A' and 'B' of FIG. 13A, respectively, to illustrate examples of a three-dimensional semiconductor memory device according to some example embodiments of the inventive concepts.

Referring to FIGS. 19A and 19B, the substrate 10 may further include a channel impurity region 11P provided below the oxidation suppressing layer 11. For example, the oxidation suppressing layer 11 may be formed between the horizontal gate insulating layer ILDb and the channel impurity region 11P. The channel impurity region 11P may be doped to have the same conductivity type as the well impurity layer 10P, and a doping concentration of the channel impurity region 11P may be greater than that of the well impurity layer 10P. The channel impurity region 11P may be used as the channel region of the ground selection transistor using the lowermost one of the electrodes EL as the gate electrode thereof. A threshold voltage of the ground selection transistor may be changed by adjusting a doping concentration of the channel impurity region 11P. In some embodiments, a doping concentration of the first conductivity type impurities included in the channel impurity region 11P may be greater than that of the oxidation suppressing material (e.g., carbon C) included in the oxidation suppressing layer 11.

Figure 22:
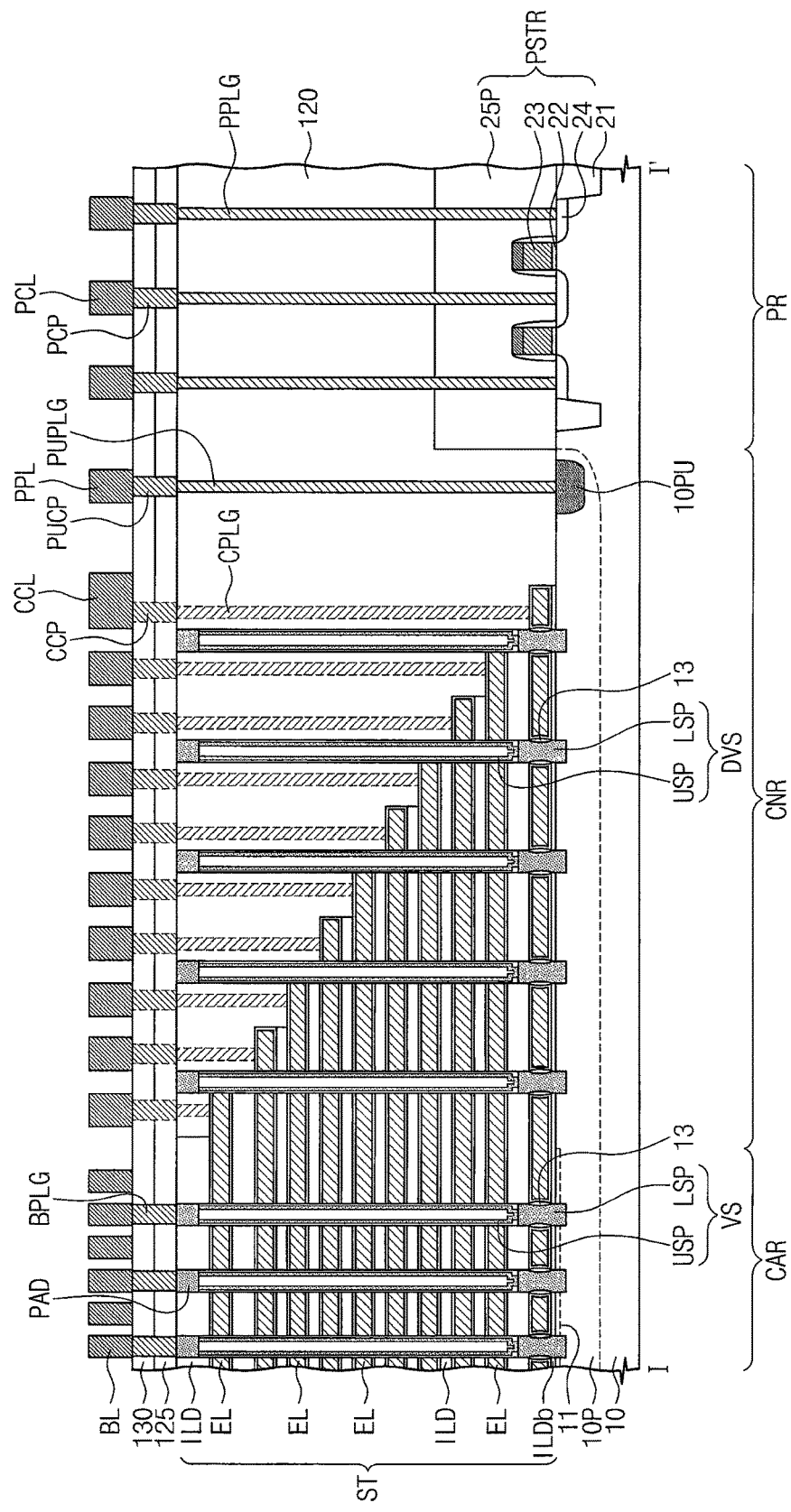
FIG. 22 is a sectional view, which is taken along line I-I' of FIG. 4 to illustrate a three-dimensional semiconductor memory device according to some example embodiments of the inventive concepts.

FIG. 22 is a sectional view, which is taken along line I-I' of FIG. 4 to illustrate examples of a three-dimensional semiconductor memory device according to some example embodiments of the inventive concepts.

Referring to FIG. 22, the stacks ST may include the horizontal gate insulating layer ILDb formed on the top surface of the substrate 10, and the electrodes and the insulating layers alternately and vertically stacked on the horizontal gate insulating layer ILDb. The oxidation suppressing layer 11 may be formed in the substrate 10, and the oxidation suppressing layer 11 may include an oxidation suppressing material (e.g., carbon C, nitrogen N, or fluorine F).

In some example embodiments, the oxidation suppressing layer 11 may be formed in the cell array region CAR of the substrate 10, and the horizontal gate insulating layer ILDb may be in contact with the oxidation suppressing layer 11 in the cell array region CAR and may be in contact with the well impurity layer 10P in the connection region CNR. On the cell array region CAR, the lower semiconductor patterns LSP of the vertical structures may be provided to pass through the oxidation suppressing layer 11 and may be connected to the well impurity layer 10P.

During the thermal oxidation process described with reference to FIGS. 16A and 16B, the oxidation suppressing layer 11 may suppress or prevent the horizontal gate insulating layer ILDb on the cell array region CAR from increasing a thickness of the horizontal gate insulating layer ILDb. Accordingly, it is possible to reduce a difference in thickness of the horizontal gate insulating layer ILDb between the cell array region CAR and the connection region CNR, even when there is a difference in oxidation rate between the cell array region CAR and the connection region CNR.

Figure 23A:
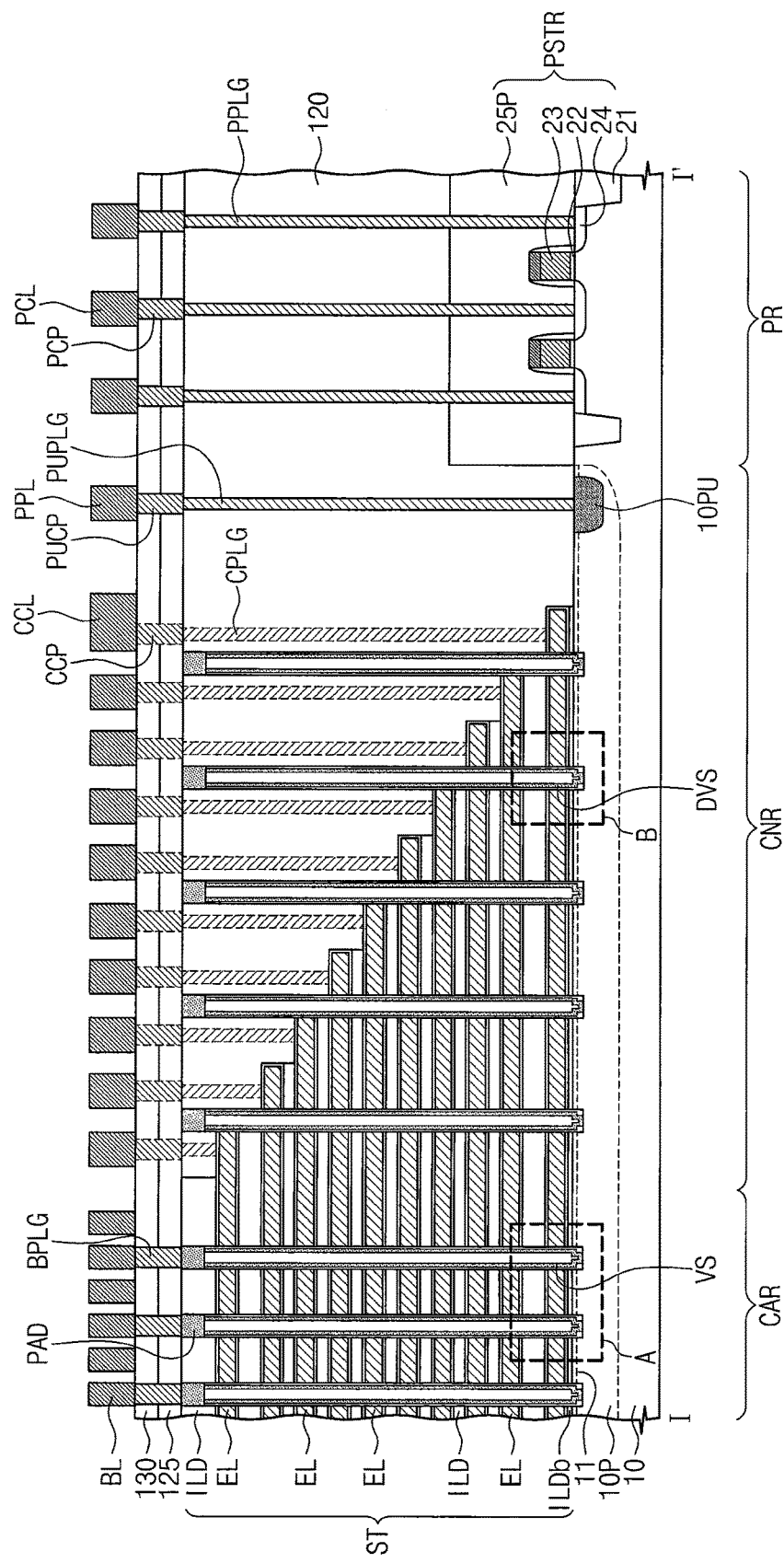
FIGS. 23A and 23B are sectional views, which are taken along lines I-I' and II-II', respectively, of FIG. 4 to illustrate a three-dimensional semiconductor memory device according to some example embodiments of the inventive concepts.
Figure 23B:
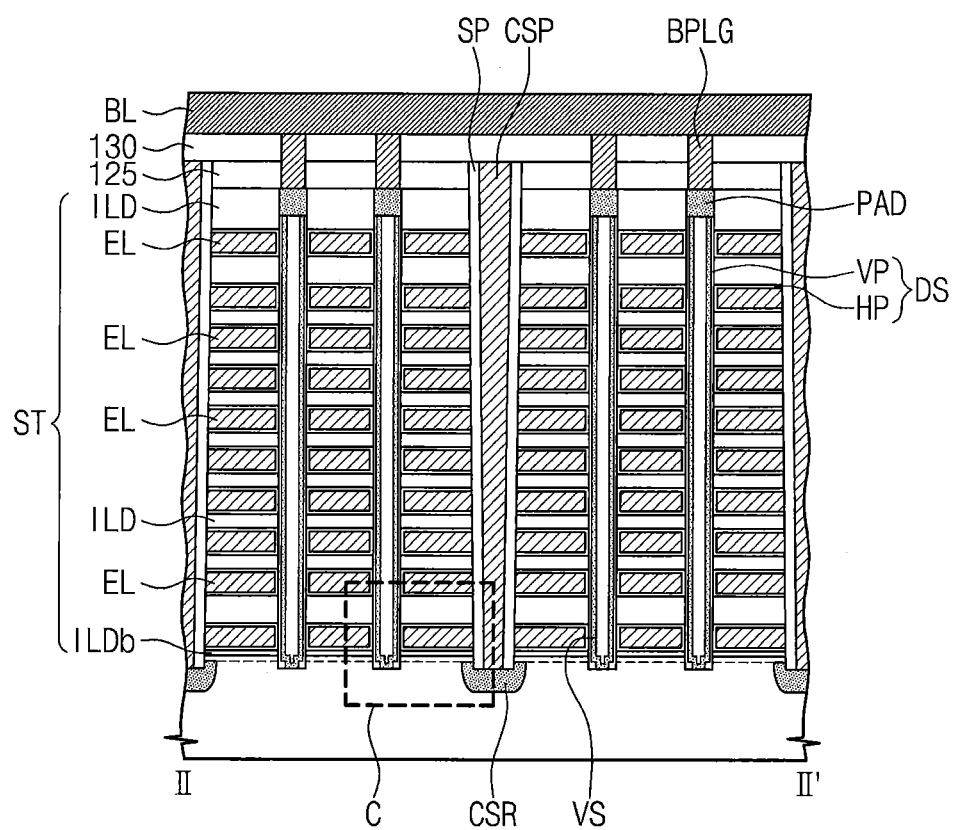
Figure 24A:
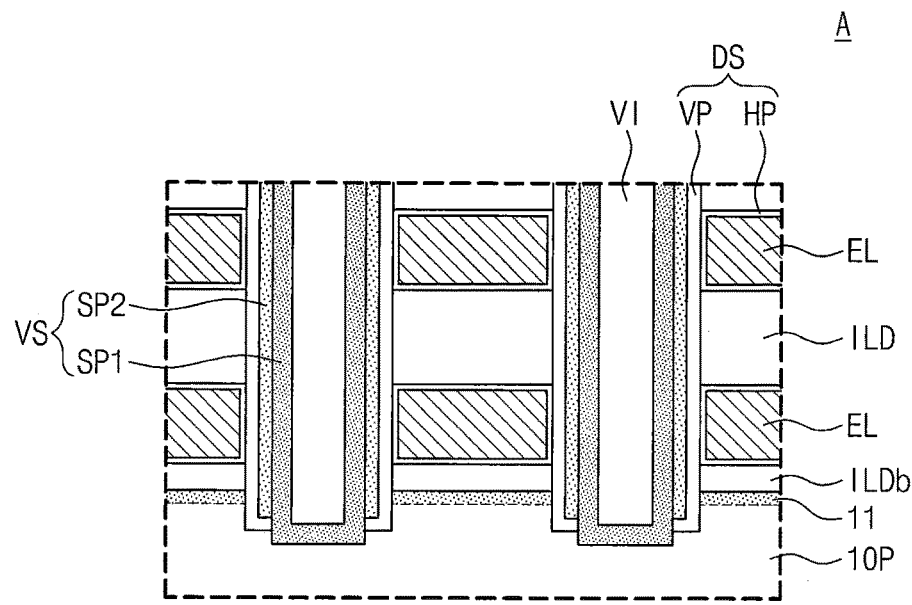
FIGS. 24A and 24B are enlarged sectional views illustrating portions 'A' and 'B', respectively, of FIG. 23A.
Figure 24B:
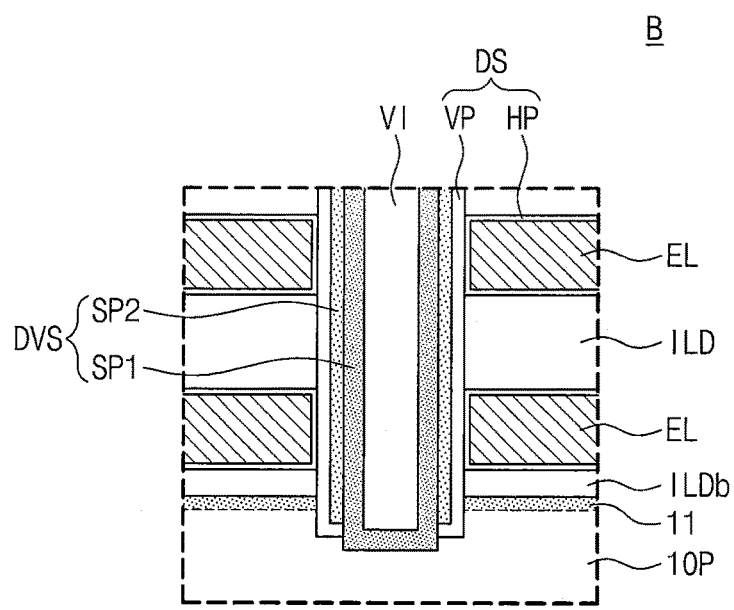
Figure 24C:
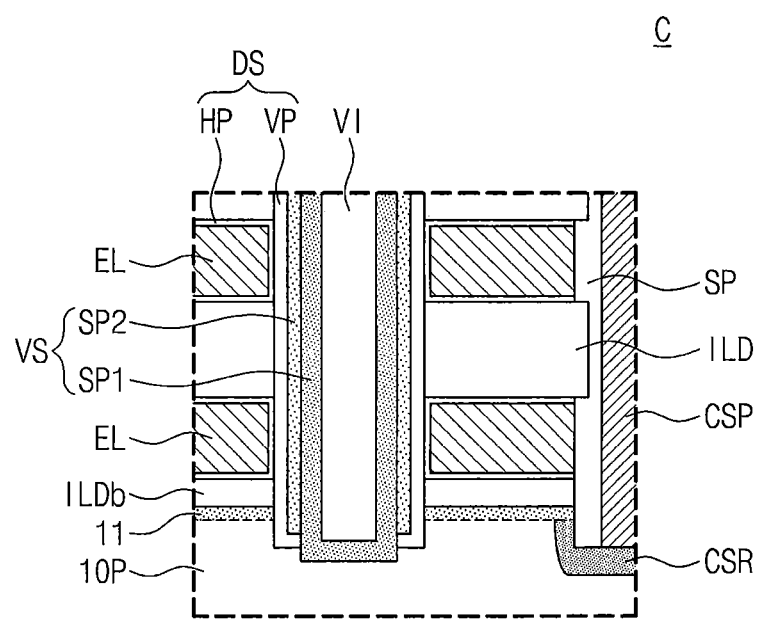
FIG. 24C is an enlarged sectional view illustrating a portion 'C' of FIG. 23B.

FIGS. 23A and 23B are sectional views, which are taken along lines I-I' and II-II', respectively, of FIG. 4 to illustrate an example of a three-dimensional semiconductor memory device according to some example embodiments of the inventive concepts. FIGS. 24A and 24B are enlarged sectional views illustrating portions 'A' and 'B', respectively, of FIG. 23A, and FIG. 24C is an enlarged sectional view illustrating a portion 'C' of FIG. 23B.

Referring to FIGS. 23A and 23B, the oxidation suppressing layer 11 may be formed in the cell array region CAR and the connection region CNR of the substrate 10, and the stacks ST extending in a specific direction may be disposed on the oxidation suppressing layer 11.

Each of the stacks ST may include the horizontal gate insulating layer ILDb in contact with the oxidation suppressing layer 11, and the electrodes EL and insulating layers ILD alternately and vertically stacked on the horizontal gate insulating layer ILDb.

On the cell array region CAR, the vertical structures VS may be provided to pass through the stacks ST and may be connected to the well impurity layer 10P. On the connection region CNR, the dummy vertical structures may be provided to pass through the stacks ST and may be in contact with the well impurity layer 10P. In some example embodiments, the vertical structures VS may be configured without the lower semiconductor patterns LSP described in the previous embodiments.

As an example, each of the vertical structures VS may include the first semiconductor pattern SP1 in contact with the well impurity layer 10P and the second semiconductor pattern SP2 interposed between the first semiconductor pattern SP1 and the data storing layer DS, as shown in FIGS. 24A to 24C. The first semiconductor pattern SP1 may be a pipe- or macaroni-shaped structure with closed bottom, and an inner space of the first semiconductor pattern SP1 may be filled with an insulating gap-fill pattern VI. The first semiconductor pattern SP1 may be in contact with an inner surface of the second semiconductor pattern SP2 and a top surface of the well impurity layer 10P. In other words, the first semiconductor pattern SP1 may be provided to electrically connect the second semiconductor pattern SP2 to the well impurity layer 10P. Furthermore, the first semiconductor pattern SP1 may have a bottom surface that is positioned at a lower level than the top surface of the substrate 10. The bottom surface of the first semiconductor pattern SP1 may be positioned at a lower level than the bottom surface of the oxidation suppressing layer 11. The second semiconductor pattern SP2 may be shaped like a hollow pipe or macaroni whose top and bottom are open. The first and second semiconductor patterns SP1 and SP2 may be in an undoped state or may be doped to have the same conductivity type as the horizontal semiconductor layer 110. The first and second semiconductor patterns SP1 and SP2 may be provided to have a polycrystalline or single crystalline structure.

Figure 25:
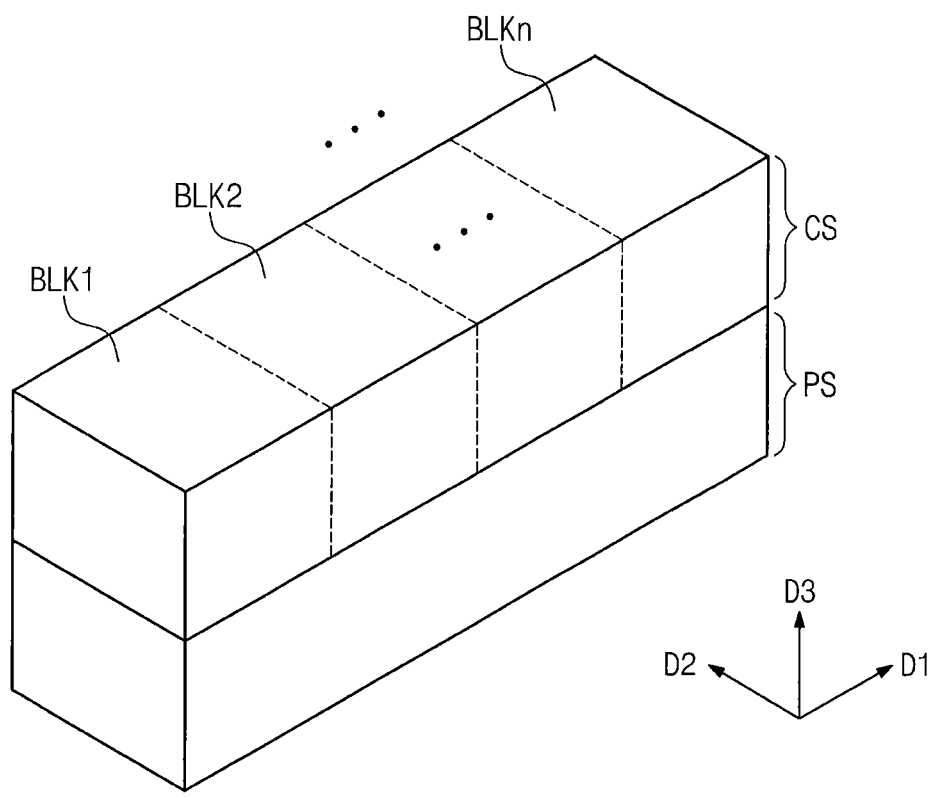
FIG. 25 is a block diagram of a three-dimensional semiconductor memory device according to some example embodiments of the inventive concepts.

FIG. 25 is a block diagram of a three-dimensional semiconductor memory device according to some example embodiments of the inventive concepts.

Referring to FIG. 25, a three-dimensional semiconductor memory device may include a lower peripheral logic structure PS and a cell array structure CS stacked on the lower peripheral logic structure PS. In other words, the lower peripheral logic structure PS and the cell array structure CS may be overlapped with each other, when viewed in a plan view.

In some example embodiments, the lower peripheral logic structure PS may include the row and column decoders 2 and 4, the page buffer 3, and the control circuits 5 previously described with reference to FIG. 1. The cell array structure CS may include a plurality of memory blocks BLK0-BLKn, each of which is configured to independently perform an erase operation. The lower peripheral logic structure PS may be provided on a plane defined by first and second directions D1 and D2, and the memory blocks BLK1-BLKn may be stacked on the lower peripheral logic structure PS in a third direction D3 normal to the plane. Each of the memory blocks BLK1-BLKn may include a 3D memory cell array, in which memory cells are vertically stacked. The memory cell array may include a plurality of three-dimensionally arranged memory cells and a plurality of word and bit lines electrically connected to memory cells (e.g., of FIG. 2).

Figure 26:
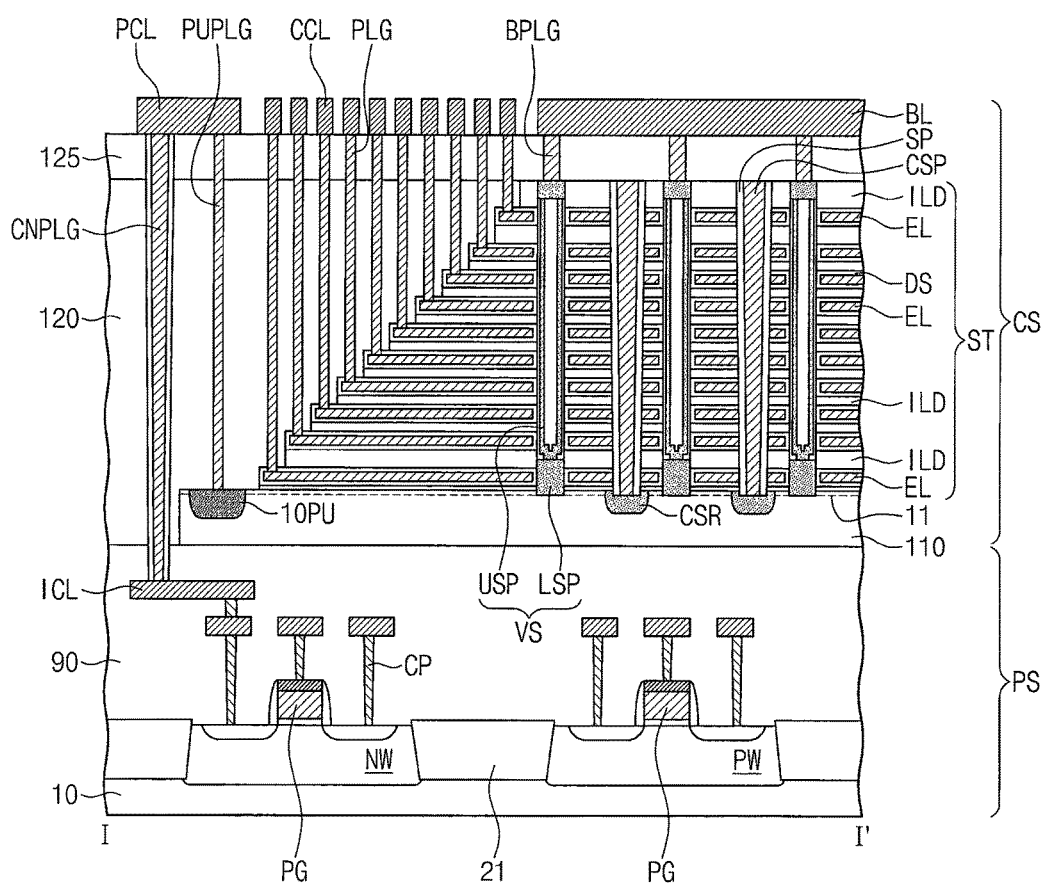
FIG. 26 is a sectional view of a three-dimensional semiconductor memory device according to some example embodiments of the inventive concepts.

FIG. 26 is a sectional view illustrating an example of the three-dimensional semiconductor memory device described with reference to FIG. 25.

Referring to FIG. 26, the lower peripheral logic structure PS and the cell array structure CS may be sequentially stacked on the substrate 10. For example, the lower peripheral logic structure PS may be positioned between the substrate 10 and the cell array structure CS in their vertical levels. In other words, when viewed in a plan view, the peripheral circuit region PR may be overlapped with the cell array region CAR.

The substrate 10 may be, for example, a bulk silicon wafer, a silicon-on-insulator (SOI) wafer, a germanium wafer, a germanium-on-insulator wafer, a silicon-germanium substrate, or a substrate with an epitaxial layer formed by a selective epitaxial growth (SEG) process.

The lower peripheral logic structure PS may include the row and column decoders 2 and 4, the page buffer 3, and the control circuits, as described with reference to FIG. 1. In other words, the lower peripheral logic structure PS may include NMOS and PMOS transistors, at least one resistor, and at least one capacitor which are electrically connected to the cell array structure CS. Such peripheral circuits may be formed on the substrate 10. The substrate 10 may include an n-well region nw doped with n-type impurities and a p-well region pw doped with p-type impurities. The n-well region nw and the p-well region pw may include active regions defined by the device isolation layer 21.

The lower peripheral logic structure PS may include peripheral gate electrodes PG, source and drain impurity regions at both sides of each of the peripheral gate electrodes PG, peripheral circuit plugs CP, peripheral circuit lines ICL, and a lower interlayered insulating layer 90 covering peripheral circuits. For example, PMOS transistors may be formed on the n-well region nw, and NMOS transistors may be formed on the p-well region pw. Peripheral circuit lines ICL may be electrically connected to the peripheral circuits via the peripheral circuit plugs CP. For example, the peripheral circuit plugs CP and the peripheral circuit lines ICL may be connected to the NMOS and PMOS transistors.

The lower filling insulation layer 90 may be provided to cover the peripheral circuits, the peripheral circuit plugs CP, and the peripheral circuit lines ICL. The lower filling insulation layer 90 may be a multilayered structure including a plurality of insulating layers.

The cell array structure CS may be provided on the lower filling insulation layer 90 and may include a horizontal semiconductor layer 110, stacks ST, and vertical structures VS.

The horizontal semiconductor layer 110 may be formed on the top surface of the lower filling insulation layer 90 covering the peripheral circuits. In other words, a bottom surface of the horizontal semiconductor layer 110 may be in contact with the lower filling insulation layer 90. As described with reference to FIG. 4, the horizontal semiconductor layer 110 may include the cell array region CAR and the connection region CNR adjacent to the cell array region CAR.

The horizontal semiconductor layer 110 may be formed of or include a semiconductor material; the horizontal semiconductor layer 110 may include at least one of silicon Si, germanium Ge, silicon germanium (SiGe), gallium arsenic (GaAs), indium gallium arsenic (InGaAs), aluminum gallium arsenic (AlGaAs), or compounds thereof. In certain embodiments, the horizontal semiconductor layer 110 may be formed of or include at least one of doped semiconductor materials (e.g., of a first conductivity type) and/or intrinsic semiconductor materials. The horizontal semiconductor layer 110 may be formed to have one of polycrystalline, amorphous, and single-crystalline structures.

As an example, the horizontal semiconductor layer 110 may include the oxidation suppressing layer 11, and the stacks ST may be disposed on the oxidation suppressing layer 11.

As described with reference to FIG. 4, the stacks ST may be provided on the horizontal semiconductor layer 110 to extend parallel to the first direction D1 and may be arranged spaced apart from each other in the second direction D2. Each of the stacks ST may include the electrodes EL, which are vertically stacked on the horizontal semiconductor layer 110, and the interlayered insulating layers ILD, which are interposed between the electrodes EL. In addition, as described above, each of the stacks ST may further include the horizontal gate insulating layer ILDb that is in contact with the oxidation suppressing layer 11.

As described above, the stacks ST may be provided to have a staircase structure on the connection region CNR, and the staircase structure may make it possible to allow the electrodes EL to be electrically connected to the lower peripheral logic structure PS. The upper filling insulation layer 120 may be provided on the horizontal semiconductor layer 110 to cover the end portions of the electrodes EL constituting the staircase structure. The capping insulating layer 125 may be provided to cover the stacks ST and the upper filling insulation layer 120. The bit lines BL may be provided on the capping insulating layer 125 to extend in the second direction D2 or cross the stacks ST. The bit lines BL may be electrically connected to the vertical structures VS through bit line contact plugs BPLG.

The vertical structures VS may be provided to pass through each of the stacks ST and may be electrically connected to the horizontal semiconductor layer 110. In some example embodiments, each of the vertical structures may include the lower semiconductor pattern LSP and the upper semiconductor pattern USP. Alternatively, each of the vertical structures may include the first semiconductor pattern, which is provided to pass through the stacks ST and is connected to the horizontal semiconductor layer, and the second semiconductor pattern interposed between the stacks ST and the first semiconductor pattern, as described with reference to FIGS. 23A, 23B, 24A, 24B, and 24C.

The data storing layer DS may be disposed between the stacks ST and the vertical structures VS.

The common source regions CSR may be provided between adjacent pairs of the stacks ST and in the horizontal semiconductor layer 110. The common source regions CSR may extend parallel to the stacks ST (i.e., in the first direction D1). The common source regions CSR may be formed by doping the horizontal semiconductor layer 110 with impurities of the second conductivity type.

The common source plug CSP may be coupled to the common source region CSR. The insulating spacer SP may be interposed between the common source plug CSP and the stacks ST. As an example, the common source plug CSP may extend in the first direction D1, and the insulating spacer SP between the stacks ST and the common source plug CSP may extend in the first direction D1. In certain embodiments, the insulating spacer SP may be provided to fill a gap between adjacent ones of the stacks ST, and the common source plug CSP may be provided to pass through the insulating spacer SP and may be coupled to the common source region CSR.

The pick-up regions 10PU may be provided in a portion of the horizontal semiconductor layer 110 that is spaced apart from the stacks ST. The pick-up regions 10PU may be formed by doping the horizontal semiconductor layer 110 with impurities of the first conductivity type. The pick-up regions 10PU may have the same conductivity type as the horizontal semiconductor layer 110, and a doping concentration of the pick-up regions 10PU may be higher than that of the horizontal semiconductor layer 110.

An interconnection structure may be provided on the end portions of the stacks ST (i.e., on the staircase structure) to electrically connect the cell array structure CS to the lower peripheral logic structure PS. The upper filling insulation layer 120 covering the end portions of the stacks ST may be provided on the horizontal semiconductor layer 110, and the interconnection structure may include contact plugs PLG, which are provided through the upper filling insulation layer 120 and are respectively connected to the end portions of the electrodes EL, and connection lines CCL, which are provided on the upper filling insulation layer 120 and are coupled to the contact plugs PLG. Vertical lengths of the contact plugs PLG may decrease with decreasing distance from the cell array region CAR.

Furthermore, the pick-up contact plugs PUPLG may be provided to pass through the upper filling insulation layer 120 and may be coupled to the pick-up regions 10PU. The pick-up regions 10PU may be formed in the horizontal semiconductor layer 110 and may be doped to have the same conductivity type as the horizontal semiconductor layer 110. Here, a doping concentration of the pick-up regions 10PU may be higher than that of the horizontal semiconductor layer 110.

The pick-up contact plugs PUPLG may be provided to have top surfaces that are substantially coplanar with those of the contact plugs PLG. The pick-up contact plug PUPLG may be connected to the lower peripheral logic structure PS through a well conductive line PCL and a connection plug CNPLG.

The connection plug CNPLG may be provided to electrically connect the cell array structure CS to the lower peripheral logic structure PS. The connection plug CNPLG may be provided to pass through the upper filling insulation layer 120 and the horizontal semiconductor layer 110 and may be connected to the peripheral circuit lines ICL of the lower peripheral logic structure PS.

According to some example embodiments of the inventive concepts, an oxidation suppressing layer may be formed in a top portion of a substrate under a horizontal gate insulating layer. The oxidation suppressing layer may allow the horizontal gate insulating layer extending from a cell array region to a connection region to have a substantially uniform thickness. This may make it possible to reduce a variation in threshold voltage of ground selection transistors on the cell array region and the connection region.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
   an oxidation suppressing layer in a substrate;
   a plurality of stacks on the oxidation suppressing layer, each of the stacks includes a horizontal gate insulating layer on the oxidation suppressing layer, and insulating layers and electrodes alternately and vertically stacked on the horizontal gate insulating layer; and
   a plurality of vertical structures passing through the stacks and connected to the substrate.

2. The device of claim 1, wherein the vertical structures have respective bottom surfaces that extend beyond the oxidation suppressing layer into the substrate.

3. The device of claim 1, wherein the oxidation suppressing layer includes carbon C, nitrogen N, or fluorine F.

4. The device of claim 1, wherein the oxidation suppressing layer has a thickness less than a thickness of the horizontal gate insulating layer.

5. The device of claim 1, wherein the substrate includes a cell array region, a peripheral circuit region, and a connection region between the cell array region and the peripheral circuit region,
   the stacks and the oxidation suppressing layer extends from the cell array region to the connection region,
   the stack on the connection region has a staircase structure, and
   a thickness of the stack on the connection region decreases stepwise in a direction toward the peripheral circuit region.

6. A three-dimensional semiconductor memory device, comprising:
   a substrate including a cell array region, a peripheral circuit region, and a connection region between the cell array region and the peripheral circuit region;
   a plurality of stacks extending from the cell array region to the connection region, wherein each stack includes a horizontal gate insulating layer, and insulating layers and electrodes alternately and vertically stacked on the horizontal gate insulating layer; and
   an oxidation suppressing layer in the substrate, the oxidation suppressing layer in contact with the horizontal gate insulating layer.

7. The device of claim 6, wherein the plurality of stacks on the connection region has a staircase structure, and
   a thickness of the stack on the connection region decreases stepwise in a direction toward the peripheral circuit region.

8. The device of claim 6, wherein the horizontal gate insulating layer has substantially equal thickness in the cell array region and in the connection region.

9. The device of claim 6, further comprising a plurality of vertical structures in the cell array region,
   wherein the vertical structures penetrate the stacks and the oxidation suppressing layer to be connected to the substrate.

10. The device of claim 6, further comprising a peripheral logic structure on the peripheral circuit region of the substrate, the peripheral logic structure spaced apart from the stacks,
    wherein a portion of the oxidation suppressing layer is disposed between the stacks and the peripheral logic structure.

11. The device of claim 6, wherein the oxidation suppressing layer has a thickness less than a thickness of the horizontal gate insulating layer.

12. A vertically integrated circuit device, comprising:
    a substrate;
    a first region of the substrate reserved for first functional circuits of the vertically integrated circuit device, the first functional circuits having a substantially constant top surface level across the first region;
    a second region of the substrate reserved for second functional circuits of the vertically integrated circuit device and spaced apart from the first region, the second functional circuits having a varied top surface level across the second region; and
    a doped oxidation suppressing material in the substrate extending from the first region to the second region at an interface of the substrate with the first functional circuits and the second functional circuits, respectively.

13. The device of claim 12 wherein the device comprises a three-dimensional semiconductor memory device, the first region comprises a cell array region, and the second region comprises a connection region directly adjacent to the cell array region on the substrate.

14. The device of claim 13 wherein the varied top surface level across the connection region has a staircase profile that descends away from the cell array region.

15. The device of claim 14 further comprising:
    a horizontal gate insulating layer contacting the doped oxidation suppressing material, the horizontal gate insulating layer included in respective ground select transistors in the cell array region and in the connection region and having a uniform thickness in the cell array region and in the connection region.

16. The device of claim 15 wherein the doped oxidation suppressing material has a thickness that is less than a thickness of the horizontal gate insulating layer.

17. The device of claim 15 wherein the doped oxidation suppressing material comprises carbon C, nitrogen N, or fluorine F.

18. The device of claim 13 wherein the three-dimensional semiconductor memory device includes vertical stacks of memory cell transistors in the cell array region, the vertical stacks each including a lower semiconductor pattern that penetrates into the substrate beyond a lower limit of the doped oxidation suppressing material.

19. The device of claim 18 further comprising:
a vertical gate insulating layer directly on the lower semiconductor pattern adjacent to the horizontal gate insulating layer.

20. The device of claim 19 wherein the vertical gate insulating layer has a convex profile.

* * * * *